(12) United States Patent
Kultran et al.

(10) Patent No.: US 9,923,549 B2
(45) Date of Patent: Mar. 20, 2018

(54) DISCRETE TIME POLYPHASE CHANNELIZER

(71) Applicant: Raytheon Company, Waltham, MA (US)

(72) Inventors: Denpol Kultran, Hawthorne, CA (US); Richard T. Hennegan, Torrance, CA (US); Harry B. Marr, Manhattan Beach, CA (US)

(73) Assignee: RAYTHEON COMPANY, Waltham, MA (US)

( * ) Notice: Subject to any disclaimer, the term of this patent is extended or adjusted under 35 U.S.C. 154(b) by 125 days.

(21) Appl. No.: 14/849,524

(22) Filed: Sep. 9, 2015

(65) Prior Publication Data

US 2017/0070212 A1   Mar. 9, 2017

(51) Int. Cl.
  *H03H 15/00*   (2006.01)
  *H03H 19/00*   (2006.01)
(52) U.S. Cl.
  CPC ............ *H03H 15/00* (2013.01); *H03H 19/00* (2013.01)
(58) Field of Classification Search
  CPC ............ H03H 15/02; H03H 2015/007; H03H 21/0001; G06F 17/14
  USPC ....................................................... 708/405
  See application file for complete search history.

(56) References Cited

U.S. PATENT DOCUMENTS

| | | | |
|---|---|---|---|
| 3,300,631 A | 1/1967 | Vallese | |
| 3,484,589 A | 12/1969 | Jernakoff | |
| 5,563,819 A | 10/1996 | Nelson | |
| 59,318,798 | 8/1999 | Khoury | |
| 6,035,320 A | 3/2000 | Kiriaki et al. | |
| 6,621,330 B1 | 9/2003 | Jaussi et al. | |
| 7,058,119 B1* | 6/2006 | Leveque | H03H 17/0254 375/140 |
| 7,058,368 B2 | 6/2006 | Nicholls et al. | |
| 7,532,684 B2* | 5/2009 | Tietjen | H04L 27/3845 375/316 |
| 8,130,879 B2 | 3/2012 | Huang | |

(Continued)

FOREIGN PATENT DOCUMENTS

EP  1638079 A2  3/2006
EP  2081294 A1  7/2009

(Continued)

OTHER PUBLICATIONS

Office action for U.S. Appl. No. 14/849,529, dated Jul. 11, 2016, 10 pages.

(Continued)

*Primary Examiner* — Chuong D Ngo
(74) *Attorney, Agent, or Firm* — Lewis Roca Rothgerber Christie LLP

(57) ABSTRACT

There is provided a finite impulse response (FIR) filter for filtering an input voltage signal to generate an output current signal, the FIR filter including a plurality of sample and hold (SH) circuits configured to simultaneously receive the input voltage signal, to sample the input voltage signal at successive sample times according to a sample clock, and to generate a plurality of sampled voltage signals, and a plurality of programmable analog multipliers coupled to the plurality of SH circuits and configured to multiply the plurality of sampled voltage signals by a plurality of binary multiplication factors to generate the output current signal.

13 Claims, 9 Drawing Sheets

(56) References Cited

U.S. PATENT DOCUMENTS

| | | | |
|---|---|---|---|
| 9,252,831 B2 | 2/2016 | Rimini et al. | |
| 2003/0076899 A1* | 4/2003 | Kumar | H04L 5/06 375/316 |
| 2003/0112644 A1 | 6/2003 | Martin et al. | |
| 2003/0184338 A1 | 10/2003 | Comer et al. | |
| 2003/0202460 A1* | 10/2003 | Jung | H04L 27/2621 370/208 |
| 2005/0094722 A1* | 5/2005 | Takatori | H03H 15/023 375/232 |
| 2005/0134369 A1 | 6/2005 | Casper et al. | |
| 2005/0271153 A1* | 12/2005 | Okamura | H04L 1/0057 375/260 |
| 2009/0290602 A1* | 11/2009 | McNeely | H04B 7/18526 370/537 |
| 2011/0282924 A1* | 11/2011 | Mallinson | H03H 15/00 708/3 |
| 2013/0115906 A1* | 5/2013 | Forman | H03D 7/18 455/313 |
| 2014/0169236 A1 | 6/2014 | Choi et al. | |
| 2014/0219139 A1 | 8/2014 | Choi et al. | |
| 2015/0078226 A1 | 3/2015 | Cha Don et al. | |

FOREIGN PATENT DOCUMENTS

| | | |
|---|---|---|
| WO | WO 2002/103684 A1 | 12/2002 |
| WO | WO 031012985 A2 | 2/2003 |
| WO | WO 2015/077741 A1 | 5/2015 |

OTHER PUBLICATIONS

Cheung et al., "A Sampled-Data Switched-Current Analog 16-Tap FIR Filter with Digitally Programmable Coefficients in 0.8μm CMOS," IEEE international Solid-State Circuits Conference, vol. 40, pp. 54-55, 1997.

Wang et al., "A Low Power 170MHz Discrete-Time Analog FIR Filter," IEEE, Custom Integrated Circuits Conference, 4 pages, 1997.

Worapishet et al., "Low Power Switched-Current FIR Core for Modern Wireless Transceivers," IEICE Trans. Electron., E87-C(11): 1903-1909, Nov. 2004.

International Search Report and Written Opinion for International Application No. PCT/US2016/041371, dated Oct. 18, 2016, 11 pages.

International Search Report dated Mar. 9, 2017 from related International Application No. PCT/US2017/012150, International Search Report dated Mar. 16, 2017 (4 pages).

Written Opinion of the International Searching Authority from related International Application No. PCT/US2017/012150, dated Mar. 16, 2017 (7 pages).

\* cited by examiner

US 9,923,549 B2

DISCRETE TIME POLYPHASE CHANNELIZER

STATEMENT REGARDING FEDERALLY SPONSORED RESEARCH OR DEVELOPMENT

This invention was made with U.S. Government support under contract No. HR0011-14-C-0002. The U.S. Government has certain rights in this invention.

CROSS-REFERENCE TO RELATED APPLICATION

This application is also related to a U.S. Patent Application entitled "Discrete Time Current Multiplier Circuit" filed Sep. 9, 2015, application Ser. No. 14/849,529, issued Jul. 11, 2017 as U.S. Pat. No. 9,703,991, the entire content of which is incorporated herein by reference.

FIELD

Embodiments of the present invention relate to the field of finite impulse response filters and systems utilizing the same.

BACKGROUND

Current radar systems are generally mission specific, expensive, and not reconfigurable. A radar system using programmable filtering and large instantaneous bandwidth may provide flexibility in system design, which may reduce system cost and deployment cycle.

Radar systems use channelizers to filter and down convert radio frequency (RF) signals received by antenna elements. Currently the RF signals from the antenna elements are phase shifted and combined and then time shifted and combined again. The resulting signal is then down converted and digitized for further processing. Polyphase filters with many taps, which are used in conventional channelizers, are currently implemented digitally and operate at sampling rates of 30 to 40 Gsps to cover RF bands of interest requiring extensive signal processing parallelism and significant power consumption. Thus, as the point of digitization in a radar detection system moves closer to the antenna, more power is being consumed due to processing of wide bandwidth signals. Analog signal processing at the antenna is more power efficient than digital signal processing.

A conventional finite impulse response (FIR) filter architecture may not be an ideal choice for analog signal processing. FIG. 1 illustrates a conventional N-tap FIR filter 100, which includes N (an integer greater than 1) sample and hold blocks 102, coefficient multipliers 104, and voltage accumulators (or voltage adders) 106 and 108. Each sample and hold block 102 introduces noise and distortions, which may result in significant distortion of the analog input signal by the time it reaches the Nth tap. Further, the coefficient multipliers 104 and the accumulators 106 and 108 introduce additional noise and nonlinearities, which further distort the analog voltages and limit the performance of the FIR filter (e.g., in terms of dynamic range and signal-to-noise ratio). Furthermore, generating the coefficient for each of the coefficient multipliers 104 may require a separate digital-to-analog converter (DAC), which increases the power consumption of the FIR filer 100.

The above information disclosed in this Background section is only for enhancement of understanding of the background of the invention and therefore it may contain information that does not form the prior art that is already known to a person of ordinary skill in the art.

SUMMARY

Aspects of some embodiments of the present invention are directed to an N-tap finite impulse response (FIR) filter utilizing an analog current multiplier and a coefficient rotation scheme, which allow for the elimination (or reduction) of sample and hold cascaded distortion errors and multiplier gain errors.

Aspects of some embodiments of the present invention are directed to a high dynamic range programmable channelization of a wide microwave spectrum, which may be used on phased array antennas near each antenna element. The implementation of the channelizer is discrete time analog and uses a polyphase filter (e.g., a filter bank) and fourier transformers to down convert multiple channels to baseband. Programmable channelization and digitization is a achieved on the array antenna at low power before element combining allowing for less interference susceptibility.

Aspects of some embodiments of the present invention are directed to a resource-efficient hardware architecture for a software-define radio (SDR) front end operating at microwave frequencies achieved using a discrete time polyphase channelizer that performs programmable frequency selection and bandwidth control.

According to embodiments of the present invention, there is provided a finite impulse response (FIR) filter for filtering an input voltage signal to generate an output current signal, the FIR filter including: a plurality of sample and hold (SH) circuits configured to simultaneously receive the input voltage signal, to sample the input voltage signal at successive sample times according to a sample clock, and to generate a plurality of sampled voltage signals; and a plurality of programmable analog multipliers coupled to the plurality of SH circuits and configured to multiply the plurality of sampled voltage signals by a plurality of binary multiplication factors to generate the output current signal.

In an embodiment, the plurality of sampled voltage signals have a same duration and are staggered in time.

In an embodiment, the FIR filter further includes a timing controller configured to generate a plurality of control signals for triggering sample times of the plurality of SH circuits, wherein consecutive ones of the plurality of control signals are offset in time by a sampling period.

In an embodiment, each one of the plurality of programmable analog multipliers is configured to convert a respective one of the plurality of sampled voltage signals to a current signal before multiplying the current signal by a respective one of the plurality of binary multiplication factors.

In an embodiment, the FIR filter further includes a plurality of coefficient registers configured to supply the plurality of binary multiplication factors to the plurality of programmable analog multipliers, wherein the plurality of coefficient registers include a same plurality of coefficients.

In an embodiment, each one of the plurality of coefficient registers includes a rotating shift register configured to store a plurality of coefficients, and to circularly rotate the plurality of coefficients through memory positions of the rotating shift register at each one of the successive sample times.

In an embodiment, the shift register is further configured to supply a coefficient of the plurality of coefficients corresponding to a first memory position of the memory positions to a respective one of the plurality of programmable analog multipliers as a multiplication factor of the plurality of multiplication factors.

In an embodiment, each one of the plurality of coefficient registers includes a localized calibration value associated with a respective one of the plurality of programmable analog multipliers, the localized calibration value compensating for gain errors of the respective one of the plurality of programmable analog multipliers.

In an embodiment, a frequency of the sample clock is programmable.

In an embodiment, the FIR filter further includes a power controller configured to selectively activate or deactivate ones of the plurality of programmable analog multipliers.

In an embodiment, outputs of the plurality of programmable analog multipliers are tied together to generate the output current signal.

In an embodiment, the output current signal includes an odd output current signal and an even output current signal, outputs of odd ones of the plurality of programmable analog multipliers are tied together to generate the odd output current signal, and outputs of even ones of the plurality of programmable analog multipliers are tied together to generate the even output current signal.

According to embodiments of the present invention, there is provided a programmable discrete time analog channelizer configured to selectively filter an analog input signal, the programmable discrete time analog channelizer including: a plurality of FIR filters, each of the plurality of FIR filters configured to receive a sample stream of a the plurality of sample streams and including: a plurality of sample and hold (SH) circuits configured to simultaneously receive the sample stream, to sample the sample stream at successive sample times, and to generate a plurality of sampled voltage signals; and a plurality of programmable analog multipliers coupled to the plurality of SH circuits and configured to multiply the plurality of sampled voltage signals by a plurality of binary multiplication factors to generate an output current signal of a plurality of output current signals; and a plurality of fourier transform circuits configured to multiply the plurality of output current signals by a plurality of fourier transform coefficients to generate a plurality of fourier transform outputs, a summation of the plurality of fourier transform outputs including a filtered output of the programmable discrete time analog channelizer, wherein the plurality of sample streams represents the analog input signal.

In an embodiment, the plurality of binary multiplication factors are programmable and determine a profile of the filtered output.

In an embodiment, the plurality of fourier transform coefficients are programmable and determine a center frequency of the filtered output.

In an embodiment, each of the plurality of FIR filters further includes: a plurality of coefficient registers configured to supply the plurality of binary multiplication factors to the plurality of programmable analog multipliers.

In an embodiment, the programmable discrete time analog channelizer further includes a timing controller configured to generate a plurality of enable signals for triggering sample times of the plurality of SH circuits of the plurality of FIR filters, wherein consecutive ones of the plurality of enable signals are offset in time by a sampling period.

In an embodiment, the programmable discrete time analog channelizer further includes a polyphase sampler configured to receive the analog input signal and to downsample the analog input signal, and to generate the plurality of sample streams.

In an embodiment, the programmable discrete time analog channelizer further includes an accumulator configured to sum plurality of fourier transform outputs and to convert the summed plurality of fourier transform outputs to a voltage signal.

According to embodiments of the present invention, there is provided a programmable discrete time analog upsampler configured to generate a radio frequency (RF) voltage signal based on a baseband input signal, the programmable discrete time analog upsampler including: a plurality of sample and hold (SH) circuits configured to simultaneously receive baseband input signal, to sample the baseband input signal at successive sample times, and to generate a plurality of sampled voltage signals; and a plurality of programmable analog multipliers coupled to the plurality of SH circuits and configured to multiply the plurality of sampled voltage signals by a plurality of binary multiplication factors to generate an output current signal of a plurality of output current signals; and a plurality of inverse fourier transform circuits configured to multiply the plurality of output current signals by a plurality of fourier transform coefficients to generate a plurality of fourier transform outputs, a commutator configured to receive the plurality of fourier transform outputs and to generate the RF voltage signal.

BRIEF DESCRIPTION OF THE DRAWINGS

The accompanying drawings, together with the specification, illustrate example embodiments of the present invention, and, together with the description, serve to explain the principles of the present invention.

DETAILED DESCRIPTION

Figure 1:
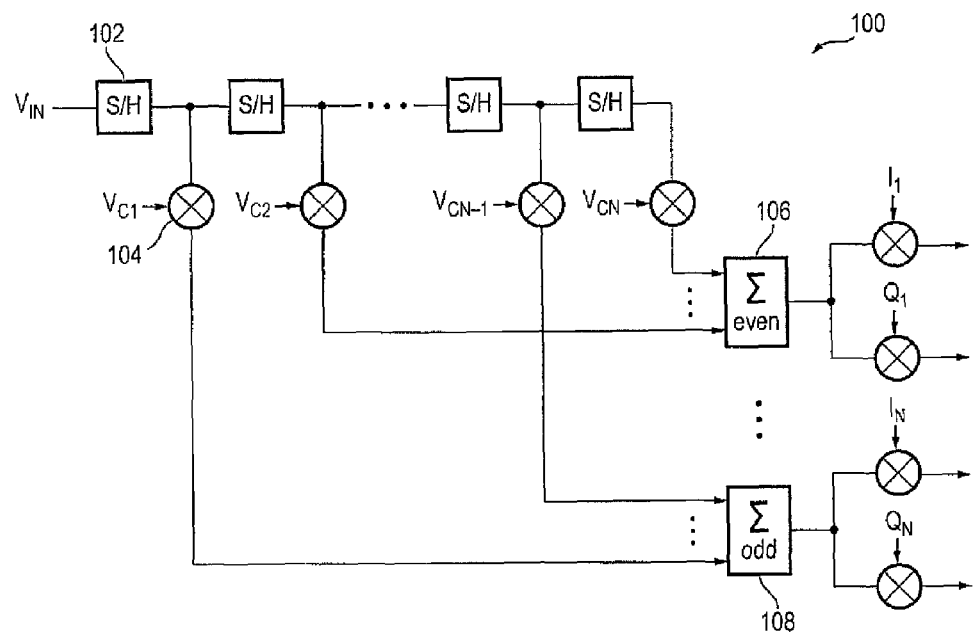
FIG. 1 is a block diagram illustrating an N-tap FIR filter according to the related art.

In the following detailed description, only certain exemplary embodiments of the present invention are shown and described, by way of illustration. As those skilled in the art would recognize, the invention may be embodied in many different forms and should not be construed as being limited to the embodiments set forth herein. Descriptions of features or aspects within each exemplary embodiment should typically be considered as available for other similar features or aspects in other exemplary embodiments. Like reference numerals designate like elements throughout the specification.

Aspects of some embodiments of the present invention are directed to a high dynamic range programmable channelization of a wide microwave spectrum, which may be used on phased array antennas near each antenna element. The implementation of the channelizer is discrete time analog and uses a polyphase filter and fourier transformers to down convert multiple channels to baseband. Each Antenna element may be followed by a channelizer that may be used to provide band-pass filtering and true time delay for beam forming purposes. Output channels may then be digitized directly by high spurious free dynamic range (SFDR) ADCs for further signal processing. Thus, programmable channelization and digitization may be achieved on the array antenna at low power before element combining, which reduces interference susceptibility. A coefficient rotation scheme allows for the elimination of sample and hold cascaded distortion errors and multiplier gain errors in FIR filters of the channelizer.

Figure 2A:
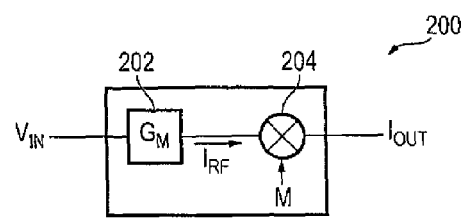
FIG. 2A is a conceptual illustration of an analog multiplier according to some exemplary embodiments of the present invention.
Figure 2B:
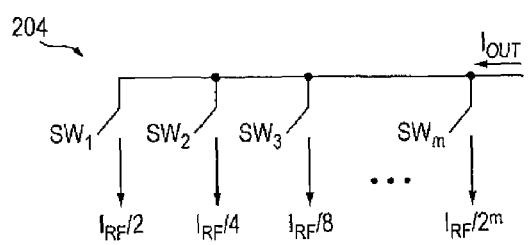
FIG. 2B is a conceptual illustration of a multiplication stage of an analog multiplier according to some exemplary embodiments of the present invention.

FIG. 2A is a conceptual illustration of an analog multiplier 200 according to some exemplary embodiments of the present invention. FIG. 2B is a conceptual illustration of a multiplication stage 204 of the analog multiplier 200 according to some exemplary embodiments of the present invention.

Referring to FIG. 2A, an analog multiplier 200 may include a transconductance stage (e.g., a voltage-to-current stage or a Gm stage) 202 for converting an input voltage signal $V_{RF}$ to a current signal $I_{RF}$, and a multiplication stage (e.g., current multiplier) 204 for multiplying the current signal $I_{RF}$ by a desired value (e.g., coefficient or multiplication factor) M to generate an output current signal $I_{OUT}$. The input voltage signal $V_{RF}$ may be a radio frequency (RF) voltage signal as detected by an antenna, as such, the input voltage signal $V_{RF}$ may have a large bandwidth, which may range from about DC (baseband) to about 18 GHz (e.g., about 0.5 GHz to about 12.5 GHz). According to some embodiments, the transconductance stage 202 exhibits high linearity, while consuming low power. For example, by amplifying the input signal $V_{RF}$ only once, the transconductance stage 202 may improve cascade third-order intermodulation distortion (IMD3) of the analog multiplier 200 by about 6 dB or more relative to an all-voltage design of the comparable art.

Referring to FIG. 2B, the multiplication stage 204 may perform fractional multiplication, that is, multiplication through current steering with m switches. The switches $SW_1$ to $SW_m$ (m being an integer greater than 1) steer various fractions of the current signal $I_{RF}$ toward the output to generate the output current signal $I_{OUT}$. For example, each of switches $SW_1$ to $SW_m$ may steer $\frac{1}{2}$ to $\frac{1}{2^m}$, respectively, of the current signal $I_{RF}$. Thus, a multiplication factor (or coefficient) M may be expressed as $$\tfrac{1}{2^m} \leq M \leq \Sigma_{k=0}^{n} \tfrac{1}{2^k} \qquad \text{(Equation 1)}$$

where, m may represent the number of binary bits used to represent the multiplication factor M, and $$I_{OUT} = M \times I_{RF}. \qquad \text{(Equation 2)}$$

Because current steering with switches is an inherently linear operation and highly tolerant to temperature variations, the analog multiplier 200 may achieve high linearity with low temperature sensitivity. Furthermore, current switching allows direct digital control over the multiplication factor M, which saves chip real estate and simplifies calibration of the multiplication factors. For example, the multiplication factor M, which is stored in memory, may be updated in real-time (e.g., during the operation of the analog multiplier) to correct for any amplitude and/or phase variation resulting from, for example, process variations, electrical variations, temperature drifts, power supply variations, and/or the like.

While in the description of the fractional multiplication above, each fraction is represented as a value less than 1, embodiments of the inventions are not limited thereto. For example, each fraction may indeed be a value greater or equal to 1. Furthermore, FIG. 3 is a detailed schematic diagram of an analog multiplier 200a that is conceptually shown in FIGS. 2A-2B, according to some example embodiments of the present invention.

Figure 3:
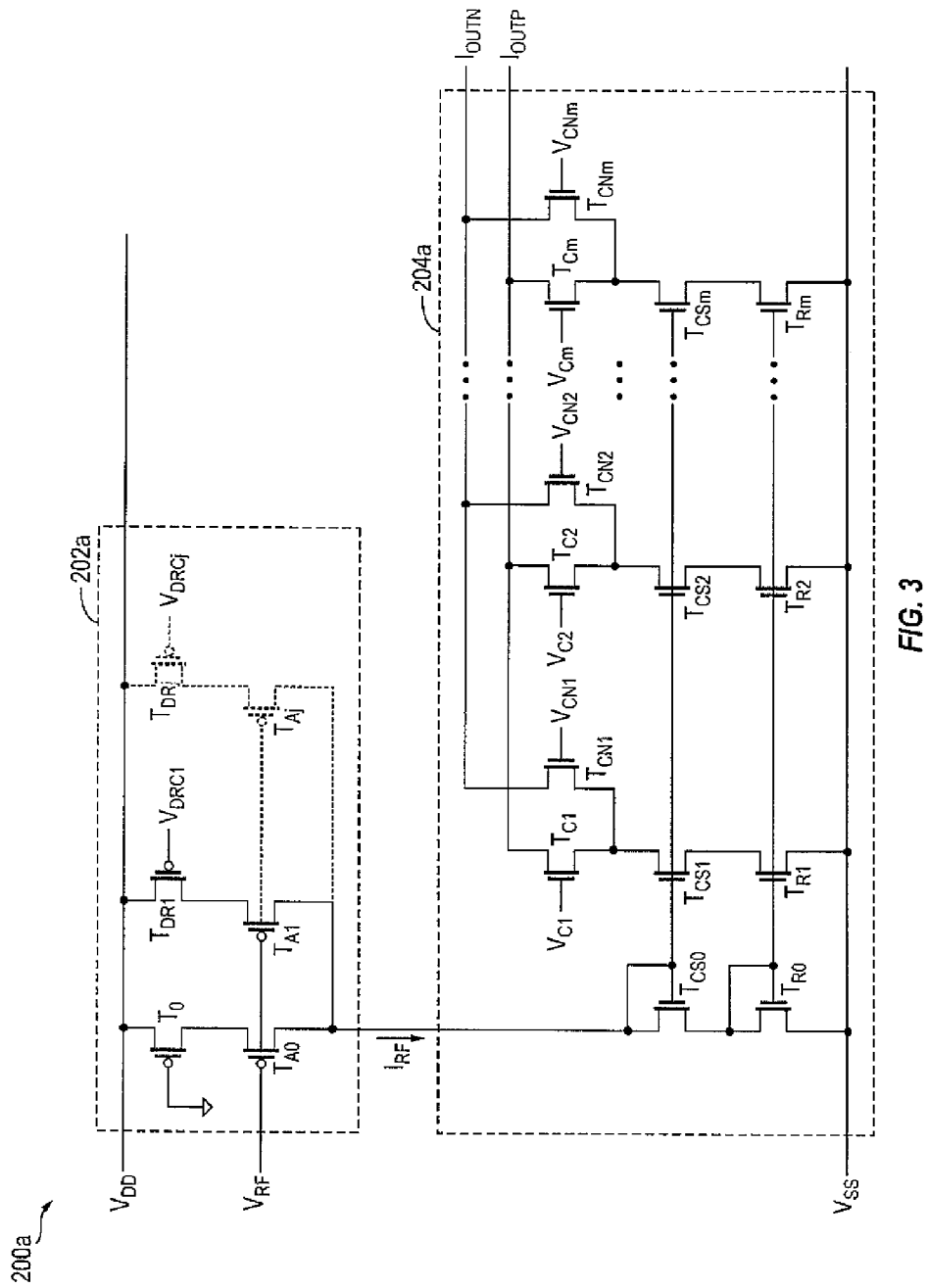
FIG. 3 is a schematic diagram of an analog multiplier that is conceptually shown in FIGS. 2A-2B, according to some example embodiments of the present invention.

Referring to FIG. 3, the transconductance stage (or transconductor) 202a of the analog multiplier 200a may be an integrated voltage-to-current convertor with programmable dynamic range. In some embodiment, the transconductance stage 202a includes a first transistor $T_0$, first and second amplifying transistors $T_{A0}$ and $T_{A1}$, and a first dynamic range control (DRC) transistor (or a first control switches) $T_{DR1}$. A first electrode (e.g., source/drain electrode) of each of the first transistor $T_0$ and the first DRC transistor $T_{DR1}$ is connected to a first voltage supply $V_{DD}$ (of, e.g., about 5 V), and a second electrode (e.g., drain/source electrode) of the same is connected to the first amplifying transistor $T_{A0}$ and the second amplifying transistor $T_{A1}$, respectively. The gate electrode of the first transistor $T_0$ may be at a fixed voltage (e.g., analog ground) so as to maintain the first transistor $T_0$ in an active (e.g., ON) state. The gates of the first and second amplifying transistors $T_{A0}$ and $T_{A1}$ may be connected to input voltage signal $V_{RF}$, and one (e.g., the first amplifying transistor $T_{A0}$) or both of the two transistors may act to amplify the input voltage signal Vat to generate the current signal $I_{RF}$ as the source-drain current.

The gate of the first DRC transistor $T_{DR1}$ is connected to a first DRC signal $V_{DRC1}$, which controls (e.g., adjusts) the dynamic range of the transconductance stage 202a, and the analog multiplier 200a. For example, if an inactive signal (e.g., a binary low signal) is applied to the (gate of) the first DRC transistor $T_{DR1}$ to inactivate (e.g., turn OFF) the transistor, only the first amplifying transistor $T_{A0}$ may be left to amplify the input voltage signal $V_{RF}$ (because the second amplifying transistor $T_{A1}$ will be inactive). However, if an active signal (e.g., a binary high signal) is applied to the (gate of) the first DRC transistor $T_{DR1}$ to activate (e.g., turn ON) the transistor, the second amplifying transistor $T_{A1}$ may also be activated and may further contribute to amplification of the input voltage signal $V_{RF}$. Thus, when both of the first and second amplifying transistors $T_{A0}$ and $T_{A1}$ are activated (e.g., in an ON state), the dynamic range of the transconductance stage 202a increase, however, power consumption also increases. As such, the transconductance stage 202a may exhibit bi-modal operation, where by modulating the first DRC signal $V_{DRC1}$, the dynamic range and power consumption of the transconductance stage 202a may be adjusted as may be suitable for a practical application.

In some embodiments of the present invention, the transconductance stage 202a may be multimodal. For example, as shown with dashed lines in FIG. 3, the transconductance stage 202a may include up to j (an integer greater than 2) DRC and amplifying transistors. Each of the DRC transistors (or control switches) $T_{DR1}$ to $T_{DRj}$ may be connected to a separate control signal (e.g., one of DRC control signals $V_{DRC1}$ to $V_{DRCj}$) that is independently controlled. Activating each DRC transistor yields higher amplification linearity at the cost of additional power consumption. Thus, a finer level of control over linearity and power consumption of the analog multiplier 200a may be achieved, which enables wider mission area coverage.

The first electrode (e.g., source/drain electrode) of the DRC transistors $T_{DR1}$ to $T_{DRj}$ may be connected to the first voltage supply $V_{DD}$.

While the DRC control signals $V_{DRC1}$ to $V_{DRCj}$ may be fixed (e.g., by connecting the gates of the corresponding DRC transistors $T_{DR1}$ to $T_{DRj}$ to a fixed voltage such as the VDD or ground), embodiments of the present invention are not limited thereto. Indeed, as the DRC control signals $V_{DRC1}$ to $V_{DRCj}$ are digital signals, a controller may dynamically adjust (e.g., adjust in real-time) the linearity/power consumption of the analog multiplier 202a as may be desired due to operation parameters. Adjustments may be made, for example, whenever a tradeoff at the chip level is desired for spur free dynamic range of this chip (linearity) for power. For example, an electronic warfare application may only desire 45 dB of spur free dynamic range in the output signal of the analog multiplier 200, whereas radar applications may need higher linearity, such as 60 dB.

Further, because only one transistor (or a series of parallel transistors, such as $T_{A0}$ to $T_{Aj}$) performs amplification of the input voltage signal $V_{RF}$, the transconductance stage 202a exhibit's low noise operation, thus improving cascade IMD3 of the analog multiplier 200 by about 6 dB or more relative to a comparable all-voltage amplifier stage.

According to some embodiments, the first transistor $T_0$ and the first through $j^{th}$ DRC transistors $T_{DR1}$ to $T_{DRj}$ may all have the same characteristics, such as transistor type (e.g., PMOS or NMOS), channel width, and channel length; however, embodiments of the present invention are not limited thereto, and one or more of the first transistor $T_0$ and the first through $j^{th}$ DRC transistors $T_{DR1}$ to $T_{DRj}$ may have characteristics that are different from others of said transistors. Further, in some embodiments, the amplifying transistors $T_{A0}$ to $T_{Aj}$ may all have the same characteristics, such as transistor type (e.g., PMOS or NMOS), channel width, and channel length; however, embodiments of the present invention are not limited thereto, and one or more of the amplifying transistors $T_{A0}$ to $T_{Aj}$ may have characteristics that are different from others of said transistors.

While FIG. 3 illustrates an embodiment in which the transistors of the transconductance stage 202a are PMOS field effect transistors (FETS), embodiments of the invention are not limited thereto. For example, as will be recognized by those of ordinary skill in the art, one or more of the transistors of the transconductance stage 202a may be a NMOS transistor. For example, all of the transistors of the transconductance stage 202a may be NMOS transistors, in which case the polarity of the voltages/signals applied to the gates of the first transistor $T_0$ and the first through $j^{th}$ DRC transistors $T_{DR1}$ to $T_{DRj}$ may be reversed.

Referring still to FIG. 3, the multiplication stage (or the coefficient multiplier) 204a of the analog multiplier 200a utilizes digital switches (i.e., transistors) to control current ratios. The multiplication stage 204a includes a first cascode transistor $T_{CS0}$ and a first ratio transistor $T_{R0}$ that are both-diode connected. For example, the gate electrode and a first electrode (e.g., drain/source electrode) of the first cascode transistor $T_{CS0}$ may be tied together (e.g., physically and/or electrically tied together), and connected to the second electrode (e.g., source/drain electrode) of the first amplifying transistor $T_{A0}$. Similarly, the gate electrode and a first electrode (e.g., drain/source electrode) of the first ratio transistor $T_{R0}$ may be electrically tied together, and connected to the second electrode (e.g., source/drain electrode) of the first cascode transistor $T_{CS0}$.

The multiplication stage 204a further includes m (an integer greater than 2) branches each including a cascode transistor $T_{CSi}$, a ratio transistor $T_{Ri}$, and first and second coefficient transistors $T_{Ci}$ and $T_{CNi}$ ($1 \le i \le m$). In each branch, the gate of the cascode transistor $T_{CSi}$ is connected to the gate of the first cascode transistor $T_{CS0}$, and the gate of the ratio transistor $T_{Ri}$ is connected to the gate of the first ratio transistor $T_{R0}$. The first electrode (e.g., drain/source electrode) of the ratio transistor $T_{Ri}$ may be connected to the second electrode (e.g., source/drain electrode) of the cascode transistor $T_{CSi}$. The second electrode (e.g., source/drain electrode) of the ratio transistors $T_{R0}$ to $T_{Rm}$ may be connected to a common second supply voltage (e.g., ground) $V_{SS}$. The first electrode (e.g., drain/source electrode) of the cascode transistor $T_{CSi}$ may be connected to the second electrodes (e.g., source/drain electrode) of the coefficient transistors $T_{Ci}$ and $T_{CNi}$. The second electrodes of the first coefficient transistors $T_{Ci}$ may be coupled to a first output $I_{OUTP}$, and the second electrodes of the second coefficient transistors $T_{CNi}$ may be coupled to a second output $I_{OUTN}$. The first and second outputs $I_{OUTP}$ and $I_{OUTN}$ form the differential output of the multiplication stage 204a and of the analog multiplier 200a.

Accordingly, each branch forms a current mirror together with the first ratio and cascode transistors $T_{R0}$ and $T_{CS0}$, and mirrors the source-drain current of the first ratio and cascode transistors $T_{R0}$ and $T_{CS0}$, which is same as the output current of the transconductance stage 202a (i.e., the current signal $I_{RF}$). The current flowing through (or output by) each branch may be a fraction of the current signal $I_{RF}$, in which the fraction corresponds to the relative characteristics (e.g., channel width and channel length) of the ratio transistors $T_{R0}$ and $T_{Ri}$. In some embodiments, the channel lengths of the ratio transistors $T_{R0}$ to $T_{Rm}$ may be substantially the same, while the channel width of successive ones of the ratio transistors $T_{R1}$ to $T_{Rm}$ may be successive fractions of that of the first ratio transistor $T_{R0}$. For example, the channel width of a ratio transistor $T_{Ri}$ ($1 \le i \le m$) may be $\frac{1}{2^i}$ of that of the first ratio transistor $T_{R0}$. Thus, the output current of each branch ($I_{OUTi}$) may be expressed as:

$$I_{OUTi} = I_{RF}/2^i \qquad \text{(Equation 3)}$$

The summation of the branch output current at the first or second outputs $I_{OUTP}$ and $I_{OUTN}$ forms the output current signal $I_{OUT}$, which is related to the current signal $I_{RF}$ as expressed in Equations 1 and 2.

The gates the first coefficient transistors $T_{C1}$ to $T_{Cm}$ may be individually controlled (e.g., activated/deactivated) via separate and independent first coefficient signals $V_{C1}$ to $V_{Cm}$. Similarly, the gates of the second coefficient transistors $T_{CN1}$ to $T_{CNm}$ may be individually controlled (e.g., activated/deactivated) via separate and independent second coefficient signals $V_{CN1}$ to $V_{CNm}$.

By selectively activating (e.g., turning ON) the first coefficient transistors $T_{C1}$ to $T_{Cm}$ and/or the second coefficient transistors $T_{CN1}$ to $T_{CNm}$, a controller may be able to steer the appropriate fractional output currents to the first output $I_{OUTPUT}$ and/or the second output $I_{OUTN}$ to effectively generate the desired current amplification.

In some embodiments, the first and second coefficient signals $V_{Ci}$ to $V_{CNi}$ (1≤i≤m) may be controlled such that the activation time (e.g., ON-time) of the first and second coefficient transistors $T_{Ci}$ and $T_{CNi}$ do not overlap (i.e., the first and second coefficient transistors $T_{Ci}$ and $T_{CNi}$ are not simultaneously activated). For example, the first and second coefficient signals $V_{Ci}$ to $V_{CNi}$ may be the binary inverse of one another. Accordingly, the analog multiplier 200a may operate differentially, that is, produce a differential current output, which is less susceptible to noise and improves performance of the system that utilizes the analog multiplier 200a. In some examples, when the first and second coefficient transistors $T_{Ci}$ and $T_{CNi}$ are both OFF, the first and second coefficient signals $V_{Ci}$ to $V_{CNi}$ may be the same (e.g., logic low).

However, embodiments of the present invention are not limited thereto, and the analog multiplier 200a may be modified to produce only a single output. For example, in each branch, either of the first or second coefficient transistors $T_{Ci}$ or $T_{CNi}$ may be maintained in a deactivated state, or may be removed from the multiplication stage 204a altogether.

In embodiments of the present invention, in which transistors of the multiplication stage 204a are manufactured via a short-channel technology (such as 45 nm technology), the transistors may be susceptible to drain-source voltage variability (also referred to as the short-channel effect), which may translate to variability in the fractional currents. In such embodiments, the cascode transistors $T_{CS0}$ to $T_{CSm}$ may alleviate or eliminate the short-channel effect by stabilizing or fixing the drain voltage at the ratio transistors $T_{R0}$ to $T_{Rm}$.

In some embodiments, the cascode transistors $T_{CS0}$ to $T_{CSm}$ may be removed from the multiplication stage 204a and the ratio transistors $T_{R0}$ to $T_{Rm}$ may be directly connected to respective ones of the first or second coefficient transistors $T_{C1}$ to $T_{Cm}$ and $T_{CN1}$ or $T_{CNm}$.

By generating the multiplication coefficient through the operation of the coefficient transistors, which act as digital switches, the multiplication stage 204a does not require a DAC, which results in significant savings in silicon area utilized by the analog multiplier 200a. For example, in some embodiments, the analog multiplier 204a has an area less than 400 µm² (e.g., occupy an 8 µm×40 µm area, or less). Further, as digital switching is a substantially temperature tolerant process, there is less variability in the performance of the multiplication stage 204a, thus allowing less calibration to be performed (e.g., calibration being performed less frequently).

The analog multiplier 200a, according to some embodiments of the present invention, does not utilize a feedback loop to prevent instability, and thus, does not experience the bandwidth reduction that would otherwise result from the feedback circuit.

FIGS. 4A-4D are graphical illustrations of the performance characteristics of the analog multiplier 200a according to some embodiments of the present invention.

Figure 4A:
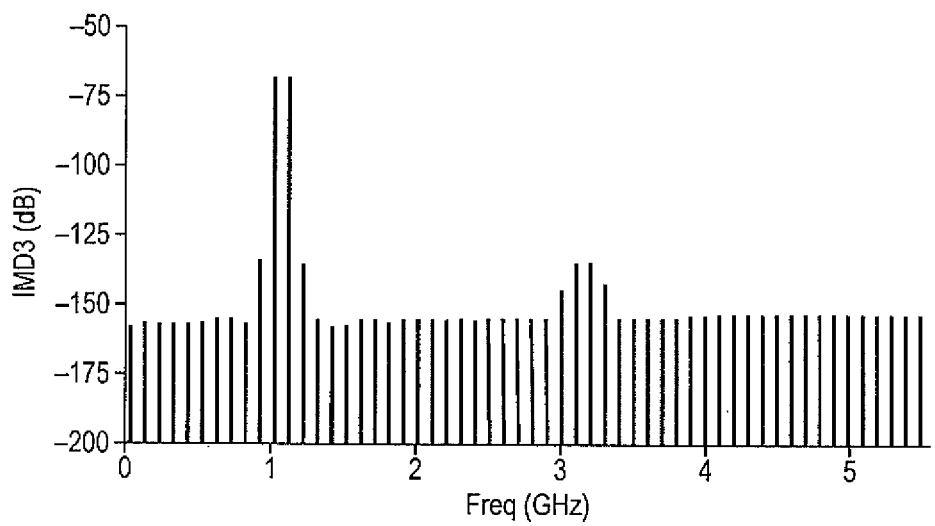
FIGS. 4A-4D are graphical illustrations of the performance characteristics of the analog multiplier 200a according to some embodiments of the present invention.

FIG. 4A is a frequency spectrum illustrating the two-tone third-order intermodulation distortion (IMD3) of the analog multiplier 200a according to some embodiments of the present invention. In some examples, the IMD3 may be about 69.8 dBc at 1.1 GHz.

Figure 4B:
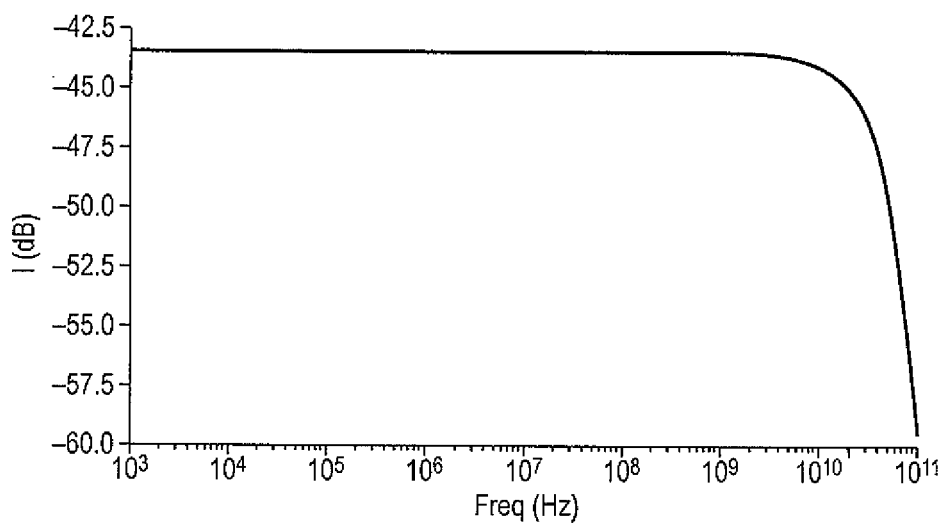

FIG. 4B is a frequency spectrum illustrating the effective bandwidth of the analog multiplier 200a according to some embodiments of the present invention. In some examples, the analog multiplier 200a may have a 3 dB bandwidth of about 33 GHz. As is shown, the amplitude is substantially flat across the 3 dB bandwidth.

Figure 4C:
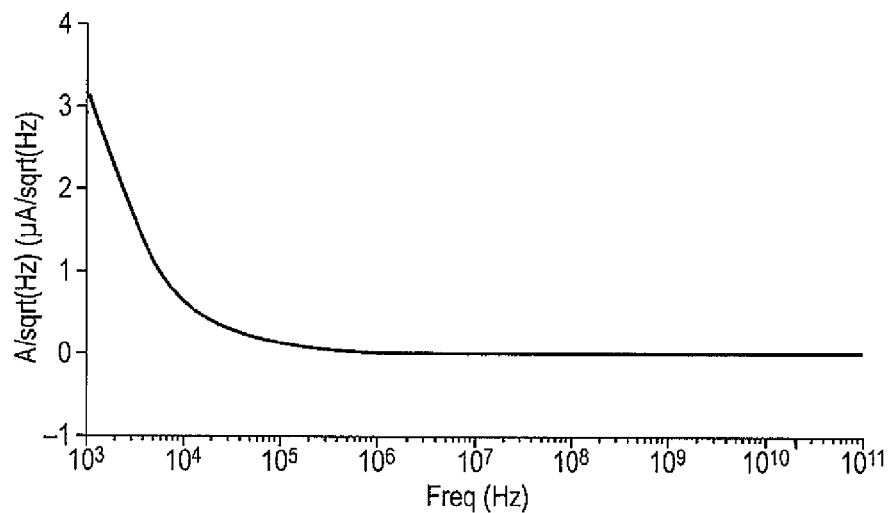

FIG. 4C is a frequency spectrum illustrating the input referred noise of the analog multiplier 200a as a function of frequency, according to some embodiments of the present invention. In some examples, the analog multiplier 200a exhibit an input noise ratio of about 4 nA/sqrt(Hz) at about 1.1 GHz.

Figure 4D:
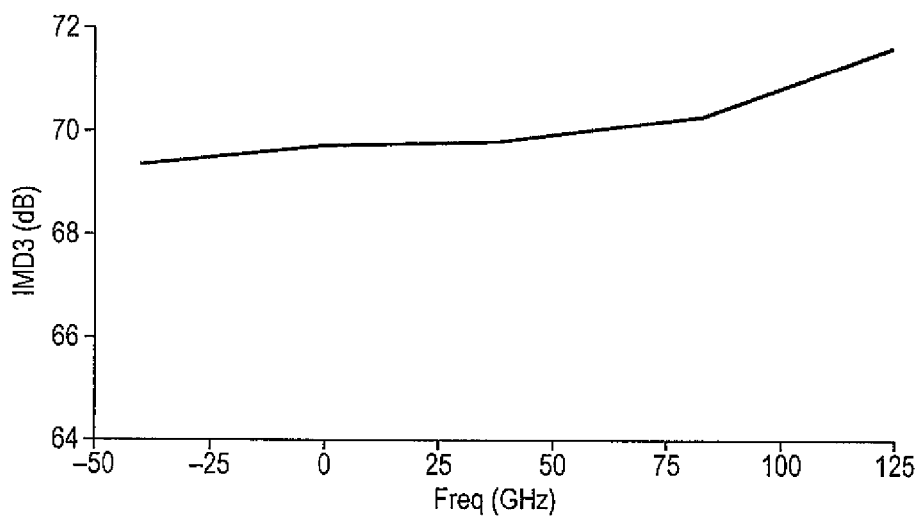

FIG. 4D is a diagram illustrating the variation in spurious free dynamic range of the analog multiplier 200a as a function of temperature, according to some embodiments of the present invention. In some examples, the IMD3 of the analog multiplier 200a varies by about less than 2 dB over a temperature range of about 170° C. Thus, the analog multiplier 200a exhibits very little (if any) degradation in spurious free dynamic range (SFDR) over temperature.

Figure 5:
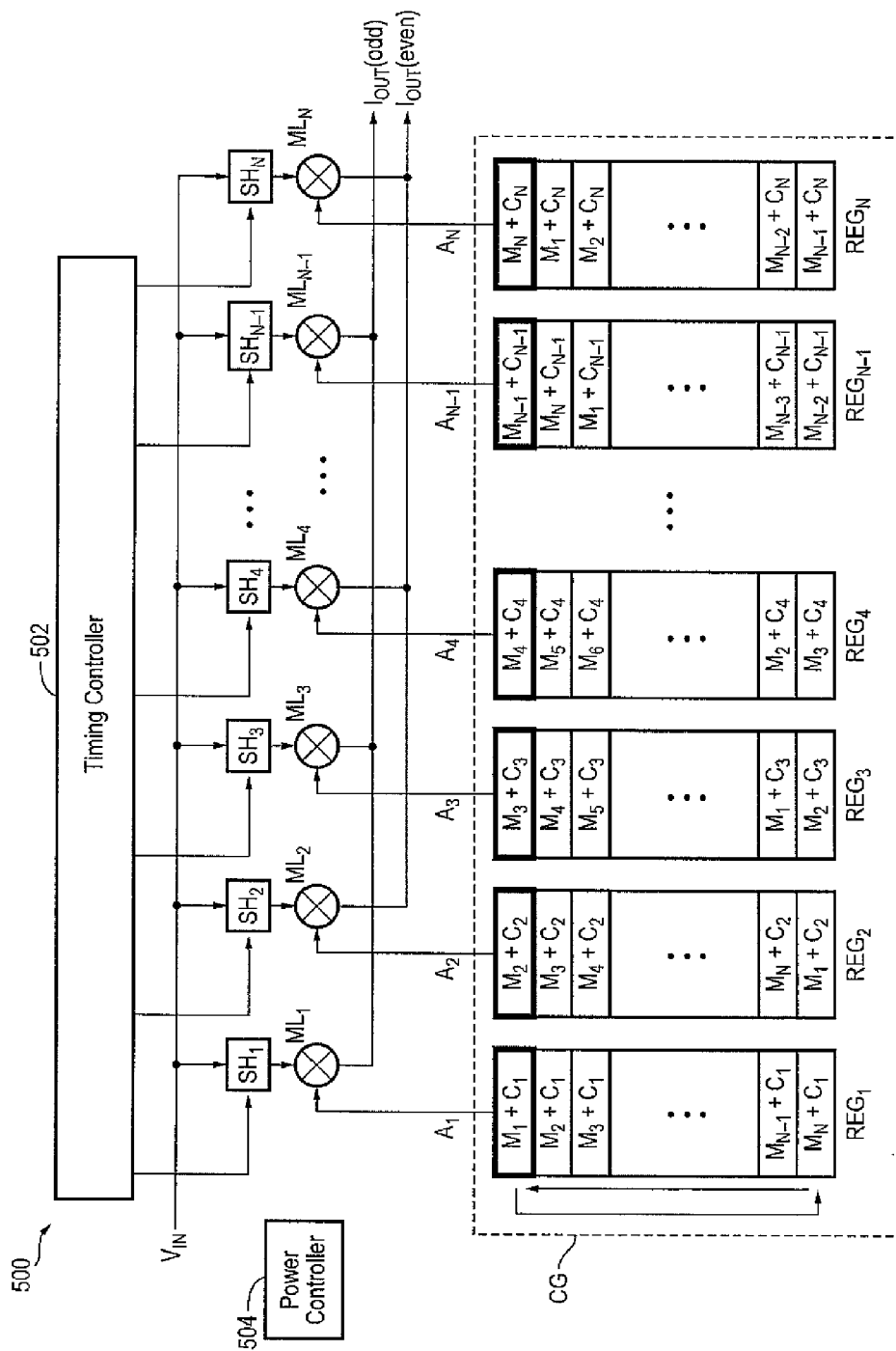
FIG. 5 is a block diagram of an N-tap finite impulse response (FIR) filter according to some embodiments of the present invention.

FIG. 5 is a block diagram of an N-tap finite impulse response (FIR) filter 500 according to some embodiments of the present invention.

Referring to FIG. 5, the FIR filter 500 has N taps (N being an integer greater than 1) and includes a plurality of sample and hold (S/H) circuits $SH_1$ to $SH_N$ for sampling and holding an input voltage signal for a period of time (e.g., one sampling period or one clock cycle), a plurality of analog multipliers $ML_1$ to $ML_N$ for converting the respective voltages sampled by the S/H circuits $SH_1$ to $SH_N$ to an amplified current signal, and a plurality of coefficient registers $REG_1$ to $REG_N$ for providing appropriate multiplication factors (or multiplication coefficients) to the analog multipliers $ML_1$ to $ML_N$.

In some embodiments, the timing of the sample and hold operation of the S/H circuits $SH_1$ to $SH_N$ may be controlled by a timing controller (or clock signal generator) 502, which generates a plurality of staggered control (or enable/clock) signals (e.g., enable/clock signals that are delayed/shifted in time), such that only one of the S/H circuits $SH_1$ to $SH_N$ samples the input voltage signal $V_{IN}$ at any given period. Thus, the sampled voltage signals supplied to successive ones of the analog multipliers $ML_1$ to $ML_N$ by the S/H circuits $SH_1$ to $SH_N$ will be delayed in time by one sampling period (e.g., inverse of sampling frequency). Further, when a S/H circuit $SH_k$ (1≤k≤N) samples the input voltage signal $V_{IN}$, the sampled voltage signal is maintained at the output of S/H circuit $SH_k$ for a period of N clock cycles (a period of N sampling periods), after which point the S/H circuit unit $SH_k$ resamples the input voltage signal $V_{IN}$. In some example, the input voltage signal $V_{IN}$ may be a continuous-time analog signal or may be a discrete-time analog signal (e.g., a sampled continuous-time signal). In some embodiments, the sampling period/frequency may be reconfigurable through software/hardware. The sampling period/frequency may further be dynamically modified as desired (e.g., during the operation of the FIR filter 500).

According to some embodiments, each of the analog multipliers $ML_1$ to $ML_N$ may be the same as or substantially the same as the analog multipliers 200 and 200a described above with reference to FIGS. 2A-2B and FIG. 3; as a result, a detailed description of the analog multipliers $ML_1$ to $ML_N$ may not be repeated hereinafter.

As shown in FIG. 5, unlike an N-tap FIR filter of comparable art (e.g., the N-tap FIR filter 100 shown in FIG. 1) in which an input signal may pass through N consecutive S/H circuits before being amplified by a multiplier, in the FIR filer 500 of the present invention, the input voltage signal $V_{IN}$ passes through only one S/H circuit. As a result, the FIR filter 500 according to the present invention exhibits less signal distortion as those of the related art. Further, as the analog multipliers $ML_1$ to $ML_N$ output current signals (rather than voltage signals), their outputs may be added simply by connecting the output ports of the analog multipliers $ML_1$ to $ML_N$ together. As such, the accumulators 106 of the related art (shown in FIG. 1), may be omitted from the FIR architecture, which results in a simpler design, lower power consumption, and further performance improvements, such as lower noise and higher linearity, as compared to the related art.

According to some embodiments, each of the plurality of coefficient registers (e.g., coefficient look-up tables) $REG_1$ to $REG_N$ stores a plurality of coefficients, which represent multiplication factors applied by analog multipliers $ML_1$ to $ML_N$ to generate the output current signal $I_{OUT}$. In some examples, the each of the coefficient registers $REG_1$ to $REG_N$ store the same N coefficients (e.g., uncalibrated coefficients) $M_1$ to $M_N$, however, the coefficients may be staggered. That is, a coefficient $M_i$ ($1 \leq i \leq N$) may occupy a first memory position in $REG_i$, a second memory position in $REG_{i+1}$, and so forth. Similarly, a coefficient $M_{i+1}$ may occupy a second memory position in $REG_i$, a third memory position in $REG_{i+1}$, and so forth. In some embodiments, each of the coefficient registers may be implemented as rotating shift registers in which the coefficients are rotated (e.g., circularly rotated) through the shift register memory positions at each sample time, that is, by moving the final entry to the first position, while shifting all other entries to the next position, or by performing the inverse operation. The circular shift of the coefficients may occur in synchronization with the S/H circuits $SH_1$ to $SH_N$. In some examples, the timing of the coefficient registers $REG_1$ to $REG_N$ may be controlled by the timing controller 502.

A coefficient occupying the first memory position at each of the coefficient registers $REG_1$ to $REG_N$ may be applied to a respective one of the analog multipliers $ML_1$ to $ML_N$ as a multiplication factor (e.g., $A_1$ to $A_N$), where the output current of analog multiplier $ML_i$ may be expressed as $$I_i = A_i \times V_{IN} \quad \text{(Equation 4)}$$

Table 1 below is a partial illustration of the operation of the S/H circuits and coefficient registers over time, according to one exemplary embodiment of the present invention. In the example of Table 1, N is an integer (e.g., an even integer) greater than 6, $V_{IN}(n)$ represents the current sampled input voltage, and consecutive sample times $t_1$ through $t_N$ are one sample time apart such that $t_1 < t_2 < t_3 \ldots < t_N$. Parameters $C_1$ to $C_N$ represent localized calibration values, which will be described in further detail below.

(odd) and $I_{OUT}$(even) of the FIR filter 500 (which are discrete-time analog signals) may be characterized as $$I_{out}(\text{odd}) = \Sigma_{k=odd} A_k \times V_{IN}(n-k+1) = (M_1+C_1) \times V_{IN}(n) + (M_3+C_3) \times V_{IN}(n-2) + \ldots \quad \text{(Equation 5)}$$

$$I_{out}(\text{even}) = \Sigma_{k=even} A_k \times V_{IN}(n-k+1) = (M_2+C_2) \times V_{IN}(n-1) + (M_4+C_4) \times V_{IN}(n-3) + \ldots \quad \text{(Equation 6)}$$

Thus, circularly rotating the coefficients has a similar affect to sample propagation in a comparable FIR filter of the related art; however, embodiments of the present invention greatly reduce or eliminate the cascaded sample and hold distortions of the comparable FIR filter of the related art.

While in an embodiment illustrated in FIG. 5, the outputs of the even and odd taps of the FIR filter 500 are summed separately, embodiments of the invention are not limited thereto. For example, the outputs of all of the analog multipliers $ML_1$ to $ML_N$ may be summed together (e.g., the corresponding outputs may be physically and/or electrically tied together) to generate a single output current signal $I_{OUT}$ expressed as:

$$I_{out}(\text{even}) = \Sigma_{k=0\ to\ N} A_k \times V_{IN}(n-k) = (M_1+C_1) \times V_{IN}(n) + (M_2+C_2) \times V_{IN}(n-1) + \ldots + (M_N+C_N) \times V_{IN}(n-N+1) \quad \text{(Equation 7)}$$

Because output of the analog multipliers $ML_1$ to $ML_N$ is current, the summation operation of Equations 5-7 may be achieved by connecting together the respective outputs (e.g., output wires). Thus, summation at the FIR filter 500 is an inherently linear operation. This greatly improves performance over the FIR filters of the related art that utilize voltage regulators, which are intrinsically non-linear.

According to embodiments of the present invention, each of the coefficient registers $REG_1$ to $REG_N$ may be localized to (e.g., be physically proximate to) a respective one of the analog multipliers $ML_1$ to $ML_N$. This may be enabled by the fact that each multiplication factor does not require a separate digital-to-analog convertor (DAC), which translates to greater power saving, reduced design complexity, and smaller footprint, as compared to analog FIR filters of the related art.

Further, as having localized coefficient alleviates the need to send bits over long distances, the clock speed (e.g., sampling rate/speed) of the analog FIR filter 500 may be increased and/or the power consumption of the analog FIR filter 500 may be decreased (due to lower transmission line parasitics) while maintaining desired system characteristics such as high IMD3 and low SFDR degradation over temperature.

TABLE 1

| Time | $SH_1$ Output | $A_1$ | $SH_2$ Output | $A_2$ | $SH_3$ Output | $A_3$ | $SH_4$ Output | $A_4$ | |
|---|---|---|---|---|---|---|---|---|---|
| $t_1$ | $V_{IN}(n)$ | $M_1 + C_1$ | $V_{IN}(n-1)$ | $M_2 + C_2$ | $V_{IN}(n-2)$ | $M_3 + C_3$ | $V_{IN}(n-3)$ | $M_4 + C_4$ | ... |
| $t_2$ | $V_{IN}(n-1)$ | $M_2 + C_1$ | $V_{IN}(n-2)$ | $M_3 + C_2$ | $V_{IN}(n-3)$ | $M_4 + C_3$ | $V_{IN}(n-4)$ | $M_5 + C_4$ | ... |
| $t_3$ | $V_{IN}(n-2)$ | $M_3 + C_1$ | $V_{IN}(n-3)$ | $M_4 + C_2$ | $V_{IN}(n-4)$ | $M_5 + C_3$ | $V_{IN}(n-5)$ | $M_6 + C_4$ | ... |
| . | . | . | . | . | . | . | . | . | |
| . | . | . | . | . | . | . | . | . | |
| $t_N$ | $V_{IN}(n-N+1)$ | $M_N + C_1$ | $V_{IN}(n)$ | $M_1 + C_2$ | $V_{IN}(n-1)$ | $M_2 + C_4$ | $V_{IN}(n-2)$ | $M_3 + C_4$ | ... |

While in the example of Table 1, N>6, embodiments of the present invention are not limited thereto, and N may be any integer greater than 1.

Because the coefficients applied as multiplication factors $A_1$ through $A_N$ to respective analog multipliers $ML_1$ to $ML_N$ are rotated (e.g., circularly shifted), the odd output $I_{OUT}$ In some embodiments, the individual values of $M_1$ to $M_N$ and $C_1$ to $C_N$ shown in Table 1 may be stored in software, and the value stored in the Coefficient registers are the multiplication factors (e.g., $A_1$ to $A_N$).

Additionally, because each coefficient is localized with a respective analog multiplier, according to some embodiments of the present invention, the coefficient may be adjusted to include calibration corrections for the respective analog multiplier. The calibration corrections may correct for multiplier gain errors, which may result from, for example, deviation in transconductance gain (gm) of the amplifying transistor $T_{A0}$ of the transconductance stage 202a (shown in FIG. 3) of the analog multiplier ML, deviations in channel width ratios of the ratio transistors $TR_0$ to $TR_m$ of the multiplication stage 204a (shown in FIG. 3) of the analog multiplier ML, and/or the like. In addition to process variation, other sources of error accounted for by the calibration correction may include voltage supply variations, temperature variations, and/or the like. The calibration corrections for analog multipliers $ML_1$ to $ML_N$ may respectively be represented with $C_1$ to $C_N$, which may be added to the uncalibrated coefficient $M_1$ to $M_N$, as shown in the exemplary embodiment of Table 1.

According to some embodiments, calibration may be performed one analog multiplier at a time, whereby a known input is supplied to the multiplier, and a deviation in the output from an expected value determines the calibration value associated with the particular analog multiplier. For example, the calibration values may compensate for gain variations resulting from variations in manufacturing process.

In some embodiments, calibration may be performed by applying a preset input to FIR filer 500, such a DC input or a known input impulse, while preset multiplier coefficients (Mi) are programmed in the coefficient registers $REG_1$ to $REG_N$ such that the coefficient values applied can be determined from the output current signal. The deviation of the determined value from the programmed value for the multiplier coefficients represents the calibration value (Ci) that is to be applied. The calibration value is then determined for a range of different temperature conditions such that a table of calibration values is determined for varying conditions under which the FIR filer 500 may be found. During operation of the FIR filer 500, an entry from the calibration value table is selected to be applied based on the current known condition of the FIR filer 500.

In some embodiments, the calibration may occur during the initialization phase of the FIR filter 500, or at regular intervals, which may correct for changes in environmental conditions, such as temperature drifts over time. According to some embodiments, real time calibrations may be applied by reading in a temperature or voltage sensor and applying a formula to compute the calibration values in real time.

In some embodiments, coefficient registers $REG_1$ to $REG_N$ are physically laid out next to the corresponding multipliers $ML_1$ to $ML_N$ to avoid a separate DAC. In some examples, the distance between corresponding coefficient registers and multipliers may be about 1 μm, or as low as allowable by a process design rule checker (DRC).

While in the exemplary embodiment shown in FIG. 5, each analog multiplier ML is associated with a single calibration value C, embodiments of the present invention are not limited thereto. For example, each of the uncalibrated coefficients $M_1$ to $M_N$ of each of the analog multipliers $ML_1$ to $ML_N$ may be associated with a separate calibration value, which may, for example, account for any multiplication non-linearities among other things. A calibration value may also be applied to reduce or mitigate non-harmonic spurs, intermodulation products, interfering signals, and/or other unwanted signals.

According to some embodiments of the present invention, the FIR filter 500 further includes a power controller 504, which may selectively power ON/OFF (e.g., activate/deactivate) each of the N taps (e.g., each of the analog multipliers $ML_1$ to $ML_N$) of the FIR filter 500 as desired. For example, the power controller 504 may control one or both of the first and second supply voltages $V_{DD}$ and $V_{SS}$ at each tap and set the voltage difference VDD−VSS to a low value (e.g., about 0 V) to turn off the respective tap, or to set the voltage difference VDD−VSS to a high voltage to turn on the respective tap. Thus, the number of taps (N) in the FIR filter 500 may be programmable (e.g., reconfigurable through software/hardware) and dynamically modified as desired (e.g., during the operation of the FIR filter 500). In such embodiments, the number of entries in each of the coefficient registers $REG_1$ to $REG_N$ may programmatically (dynamically) vary to correspond to the number of taps that are powered ON (e.g., active) at any given time.

The number of taps (N) and the coefficients applied to the taps of the FIR filter 500, which are stored/generated by the coefficient registers $REG_1$ to $REG_N$, determine the filtering profile (e.g., center frequency, bandwidth, and shape) of the FIR filter 500. Further, as the coefficients stored/generated by each of the coefficient registers $REG_1$ to $REG_N$ is in the form of digital bits, the filtering profile of the FIR filter may be programmed (e.g., reconfigured through software/hardware) as desired (e.g., during the operation of the FIR filter 500).

As will be understood by those of ordinary skill in the art, the FIR filter 500 may further include components that are not shown in FIG. 5, such as accumulators, invertors, and/or the like. Constituent components like S/H circuits can be implemented as discrete (digital or analog) components, integrated chips (ICs), FPGAs, or the like and may include field effect transistors (FETs), bipolar junction transistors (BJTs), and/or the like.

Figure 6:
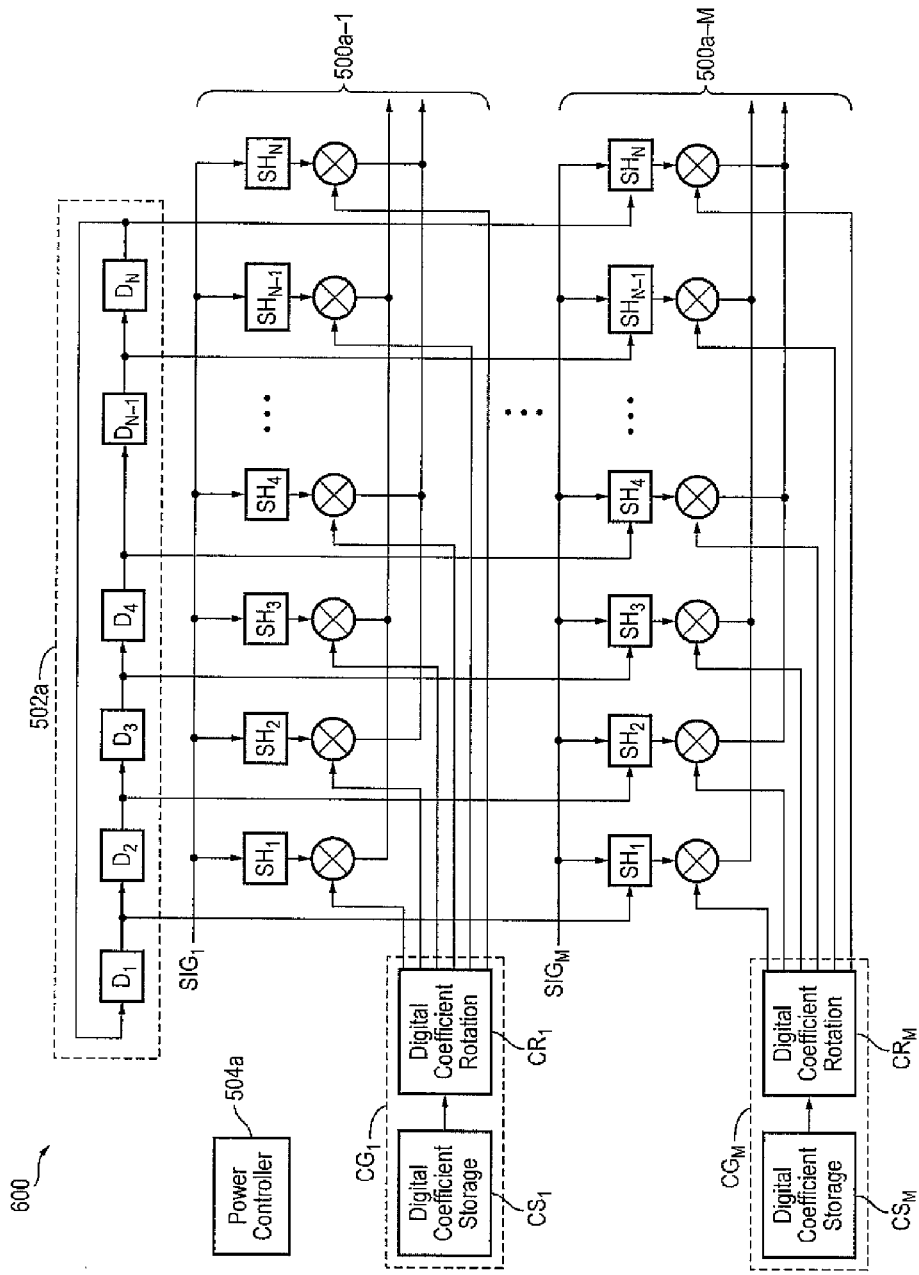
FIG. 6 is a block diagram of a FIR filter bank according to some embodiments of the present invention.

FIG. 6 is a block diagram of a FIR filter bank 600 according to some embodiments of the present invention.

Referring to FIG. 6, the FIR filter bank 600 includes a series of M parallel FIR filters 500a (M being an integer greater than 1), which may act as band-pass filters operating different frequency sub-bands. Each of the FIR filters 500a-1 to 500a-M may be the same or substantially the same as the N-tap FIR filter 500 described above with reference to the embodiments of FIG. 5 and, as such, a detailed description of the FIR filters 500a-1 to 500a-M may not be repeated hereinafter. The series of M FIR filters 500a-1 to 500a-M operating in parallel may share a common timing controller 502a. For example, a single timing controller 502a may control the sampling time of M FIR filters 500a-1 to 500a-M.

In some embodiments, a timing controller 502a includes a plurality of delay circuits circularly connected in series. That is the output of each delay circuit is connected to the input of the next delay circuit and the output of the last delay circuit is connected to the input of the first delay circuit. For example, a timing controller 502a that is used to supply sample enable (or control) signals to one or more N-tap FIR filters 500a may include N delay circuits $D_1$ to $D_N$ that are circularly connected in series, each of which delay an input signal by a sampling period (e.g., one clock cycle). Thus, the timing controller 502a supplies rotating sample enable (or control) signals to the S/H circuits $SH_1$ to $SH_N$ of the M N-tap FIR filter 500a-1 to 500a-M.

Each of the delay circuits $D_1$ to $D_N$ may implemented using any suitable analog or digital circuit as recognized by those of ordinary skill in the art (such as a CMOS analog delay circuit using a holding capacitor). Further, the timing controller 502a is not limited to the embodiments described above, and may be implemented in any suitable circuit, as recognized by those of ordinary skill in the art.

According to some embodiments, each of the M N-tap FIR filters 500a-1 to 500a-M may have a separate coefficient generator $CG_i$ (1≤i≤M), which is the same or substantially the same as the coefficient generator CG of the embodiments of FIG. 5. In some examples, the coefficient generator $CG_i$ may include a coefficient storage (e.g., a digital coefficient storage) $CS_i$ and a coefficient rotator (e.g., a digital coefficient rotator) $CR_i$. The coefficient storage $CS_i$ may store the coefficients (e.g., the uncalibrated coefficients $M_1$ to $M_N$ or calibrated coefficients $M_1+C_1$ to $M_N+C_N$) for the individual analog multipliers $ML_{11}$ to $ML_{NM}$ of the M FIR filters 500a-1 to 500a-M. The coefficient rotator $CR_i$ rotates (e.g., circularly rotates) the coefficients as described above with reference to the example of Table 1 and the embodiments of FIG. 5.

As the coefficients generated by each of the coefficient generators $CG_1$ to $CG_M$ is in the form of digital bits, the filtering profile of the FIR filters 500a-1 to 500a-M may be programmed (e.g., reconfigured through software/hardware) as desired (e.g., during the operation of the FIR filter bank 600) through software.

In some embodiments, by adjusting the coefficients produced by the coefficient generators $CG_1$ to $CG_M$, the center frequency and bandwidth of the FIR filter 500a-1 to 500a-M are configured such that successive FIR filters produce overlapping bands.

According to some embodiments of the present invention, the FIR filter bank 600 further includes a power controller 504a, which powers ON/OFF (e.g., activates/deactivates) each of the FIR filters 500a-1 to 500a-M. In some embodiments, the power controller 504a may control each of the N taps of each of the FIR filters 500a-1 to 500a-M. The power controller 504a may be the same or substantially the same as the power controller 504 of the embodiments of FIG. 5. Thus, the number of taps (N) in each of the FIR filters 500a-1 to 500a-M and/or the number of FIR filters (M) may be programmable and dynamically modified as desired.

In FIG. 6, elements and components that were not necessary to the description of the exemplary embodiments of the present invention may not have been shown. Thus, as will be recognized by those of ordinary skill in the art, the FIR filter bank 600 may include components that are not shown in FIG. 6, such as one or more samplers, accumulators, and/or the like.

According to some embodiments of the present invention, the FIR filter 500 (and. e.g., the FIR filter bank 600) is utilized in a hardware architecture for achieving high dynamic range programmable channelization of a wide microwave spectrum, which may be used on phased array antennas near each antenna element. The implementation may be in discrete time analog and may use a polyphase filter and discrete fourier transform (DFT) circuits to down convert frequencies of multiple channels to baseband frequencies. In some embodiments, each antenna element of the phased array antenna is followed by a channelizer that may be used to provide band-pass filtering and true time delay for beam forming purposes. Output channels of the channelizer may then be digitized directly by analog-to-digital convertors ADCs (e.g., high SFDR ADCs) for further signal processing.

Figure 7:
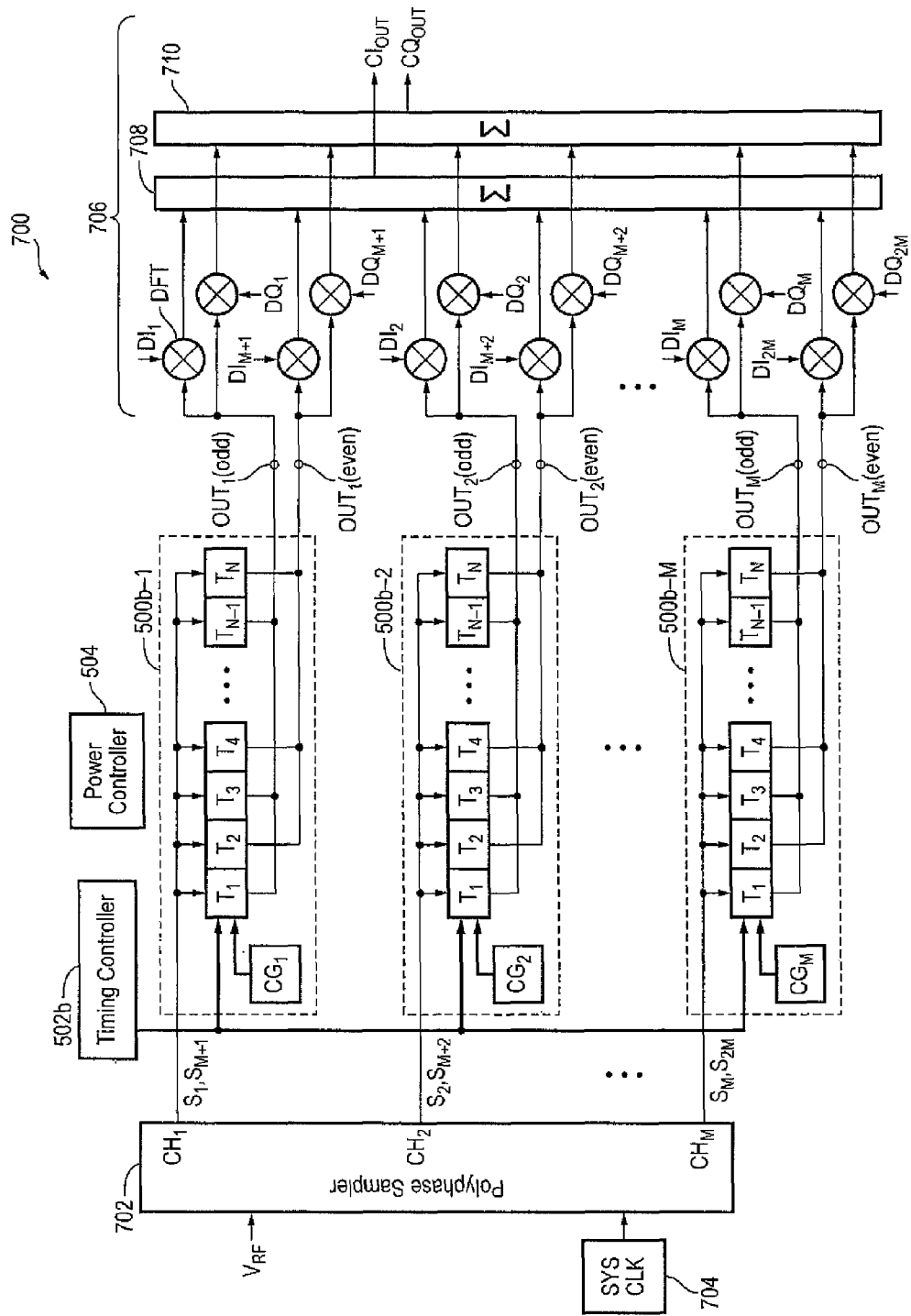
FIG. 7 is a block diagram illustrating a discrete time polyphase channelizer according to some example embodiments of the present invention.

FIG. 7 is a block diagram illustrating a channelizer (e.g., a discrete time polyphase channelizer) 700 according to some example embodiments of the present invention.

Referring to FIG. 7, an antenna front-end (e.g., a software-define radio (SDR) front end) operating at microwave frequencies may be achieved using the channelizer 700, which is configured to perform programmable frequency selection and bandwidth control.

According to some embodiments, the channelizer 700 includes a polyphase sampler 702 for downsampling an incoming radio frequency (RF) signal $V_{RF}$ into multiple channels, a system clock generator 704 for generating a clock signal for the polyphase sampler 702, one or more FIR filters 500b acting as band-pass channel filters, and a fourier transform block 706 for down-converting frequencies of the filtered signals of the multiple channels to baseband frequencies and, concurrently, digitizing the down-converted signals.

In some embodiments, the polyphase sampler 702 receives the incoming RF signal $V_{RF}$ from an antenna element of the polyphase antenna that the channelizer 700 is located next to. The RF signal VRF may be a microwave signal having frequencies ranging from DC to about 13 GHz (e.g., about 0.5 GHz to about 12.5 GHz). However, embodiments of the present invention are not limited thereto, and the channelizer 700 may operate on wideband signals with frequencies from, for example, DC to about 18 GHz or higher. In some embodiments, the polyphase sampler 702 divides the incoming RF signal $V_{RF}$ to M (an integer greater than 1) frequency domains or channels $CH_1$ to $CH_M$ by downsampling or decimates the RF signal $V_{RF}$ by a factor of M such that each channel outputs one in every M samples. Thus, in an example in which M equal 8 and the system clock is about 26 GHz (e.g., for a 13 GHz bandwidth input signal), each of the M channels outputs samples at about 3.25 GHz. In some embodiments, the outputs of the channels $CH_1$ to $CH_M$ are staggered such that the output of a $CH_i$ (1≤i≤M) is a sequence of analog samples (e.g., a discrete-time analog sample stream) including an (i)th sample Si, an (i+M)th sample $S_{i+M}$, an (i+2M)th sample $S_{i+2M}$, and so forth.

The sample stream of each channel is supplied to the input of a respective one of the M FIR filters 500b-1 to 500b-M, which may be same or substantially the same as the FIR filter 500a. The M FIR filters 500b-1 to 500b-M may be coupled together and cooperatively operate in a manner substantially similar to the description above with reference to the FIR filter bank 600 of the embodiments of FIG. 6. The timing controller 502b (which may be the same or substantially the same as the timing controller 502 and 502a of FIGS. 5-6) may concurrently (e.g., simultaneously) provide staggered control (or enable/clock) signals to the N taps $T_1$ to $T_N$ of each of the FIR filters 500b-1 to 500b-M. Each tap $T_i$ (1≤i≤M) includes a S/H circuit and an analog multiplier as described above with reference to FIG. 5. As described above, the inputs of all S/H circuits of the N taps $T_1$ to $T_N$ are tied together (e.g., physically and/or electrically tied together), the analog samples (e.g., discrete-time analog samples) at each S/H circuit remain stationary until replaced, and the digital taps weights (i.e., the coefficients) are rotated, which allow the FIR filters 500b-1 to 500b-M (and thus the channelizer 700) to achieve analog sample uniformity. The outputs of the even and odd taps may be current summed separately as OUT(even) and OUT(odd) (e.g., by coupling or tying together the outputs of the even taps and, separately, the odd taps) before being supplied to the fourier transform block 706.

The number of taps (N) and the coefficients applied to the taps $T_1$ to $T_N$ of a FIR filter 500b-i (1≤i≤M), which are generated by the coefficient generator $CG_i$, determine the filtering profile (e.g., center frequency, bandwidth, and shape) of the FIR filter 500b-i. In some embodiments, the center frequency and bandwidth of the FIR filter 500b-1 to 500b-M are configured such that successive FIR filters produce overlapping bands so as to eliminate spectral holes between adjacent channels.

In some embodiments, the fourier transform block 706 includes a plurality of DFT circuits (or fourier transform circuits) coupled to the even and odd outputs OUT(even) and $OUT_i$(odd) (1≤i≤M) of the M FIR filters 500b-1 to 500b-M, an imaginary accumulator 708, and a real accumulator 710. For example, two DFT circuits may be connected to and operate (e.g., perform an analog operation) on each of the even and odd outputs $OUT_i$(even) and $OUT_i$(odd).

According to some embodiments, the imaginary and real DFT coefficients $DI_i$ and $DQ_i$ (1≤i≤M) are applied to the corresponding ones of the two DFT circuits connected to (and operating on) the odd output $OUT_i$(odd) of the FIR filter 500b-i, and the imaginary and real DFT coefficients (e.g., the imaginary and real fourier transform coefficients) $DI_{j+M}$ and $DQ_{i+M}$ are applied to the corresponding ones of the two DFT circuits connected to (and operating on) the even output $OUT_i$(even) of the FIR filter 500b-i. Thus, according to some embodiments, the DFT circuits coupled to the odd output $OUT_1$(odd) use coefficients $DI_i$ and $DQ_1$, and the DFT circuits coupled to the even output $OUT_1$(even) use coefficients $DI_{M+1}$ and $DQ_{M+1}$. Further, the DFT circuits coupled to the odd output $OUT_2$(odd) use coefficients $DI_2$ and $DQ_2$, and the DFT circuits coupled to the even output $OUT_2$(even) use coefficients $DI_{M+2}$ and $DQ_{M+2}$. Similarly, the DFT circuits coupled to the odd output $OUT_M$(odd) use coefficients $DI_M$ and $DQ_M$, and the DFT circuits coupled to the even output $OUT_M$(even) use coefficients $DI_{2M}$ and $DQ_{2M}$.

Further the imaginary and real DFT coefficients may be expressed as:

$$DI_k = \cos\left(\frac{2\pi n(k-1)}{2M}\right) \quad \text{(Equation 8)}$$

$$DQ_k = -\sin\left(\frac{2\pi k(k-1)}{2M}\right) \quad \text{(Equation 9)}$$

where odd samples are represented with k=1 to M, even samples are represented with k=M+1 to 2M, n=1 to M−1, and every other output sample from the DFTs is inverted. Setting n to a value between 1 and M−1, the output of the channelizer 700 (e.g., the fourier transform block 706) may reflect one of M−1 bandpass responses that the channelizer 700 is capable of generating. For example, the value n may determine the center frequency of the bandpass response of the channelizer 700.

According to some embodiments, each DFT may be the same or substantially the same as the multiplication stage 204 of the analog multipliers 200a, described above with reference to the embodiments of FIG. 3; thus a detailed description thereof may not be repeated. In some embodiments, the DFT coefficients $DI_k$ and $DQ_k$ may be represented in digital bits and applied to the multiplication stage 204 as a multiplication factor M that is expressed by Equation 1.

In some embodiments, the DFT circuits may be replaced by fast fourier transform (FFT) circuits. In such embodiments, a different number of FFT circuits (i.e., different from 2M) may be utilized and coefficients may be adjusted accordingly.

In some embodiments, the imaginary accumulator 708 sums (e.g., current sums) the outputs (e.g., discrete-time analog outputs) of the DFT circuits associated with the imaginary coefficients $D_1$ to $DI_{2M}$ to generate an imaginary channelizer output $CI_{OUT}$, and the real accumulator 710 sums (e.g., current sums) the outputs of the DFT circuits associated with the real coefficients $DQ_1$ to $DQ_{2M}$ to generate a real channelizer output $CQ_{OUT}$.

As the coefficients generated by each of the coefficient generators $CG_1$ to $CG_M$ and the imaginary and real DFT coefficients $DI_k$ and $DQ_k$ are in the form of digital bits, the filtering profile of the FIR filters 500b-1 to 500b-M and the channelizer 700 may be programmed (e.g., dynamically reconfigured through software/hardware) as desired (e.g., during the operation of the channelizer 700).

In some embodiments, the fourier transform outputs of the DFTs may be in the form of current signals and the accumulator 708 may perform the current sum operation by coupling or tying the outputs of the DFTs together at a node. In some examples, the accumulator 708 may generate the output $CQ_{OUT}$ as a current signal. In other examples, the accumulator 708 may convert the accumulated current to a voltage signal (by, e.g., passing the accumulated current through a resistor). The output $CQ_{OUT}$ may be passed to a ADC to convert the discrete analog signal to a digital signal for further signal processing.

Thus, the channelizer 700 (e.g., the fourier transform block 706) achieves frequency interleaving using even and odd FIR Taps $T_1$ to $T_N$ and the imaginary and real coefficients $DI_1$ to $DI_{2M}$ and $DQ_1$ to $DQ_{2M}$ to create a 2M point DFT. In some examples, the DFT length is twice as large as the decimation rate so that overlapping frequencies can be achieved. Accordingly, the channelizer 700 performs filtering and down conversion concurrently (e.g., simultaneously) at sample time.

Referring to FIG. 7, the channelizer 700 represents a M×N tap discrete time analog channelizer that can be programmed for frequency selection and bandwidth control. The channelizer 700 may perform the equivalent function of multi-channel RF FIRs and down converter to baseband with overlapping frequency coverage. As described with reference to the embodiments of FIGS. 6-7, a coefficient rotation method may be applied so that samples of the input RF signal (e.g., $S_1$, S2, . . . SM, etc.) need not be moved so that the signal fidelity is not impacted more than once, which is the first sampling sample and hold operation (by a S/H circuit). Thus, the coefficient rotation implementation improves the dynamic range performance of the channelizer 700.

According to some embodiments, the channelizer is positioned at the antenna front end, which improves (e.g., increases) the dynamic rate of the channelizer 700 after noise decorrelation, as compared to that of channelizers of the related art.

Accordingly, the channelizer 700 enables a programmable (e.g., reconfigurable through software/hardware) and resource-efficient hardware architecture for a software-define radio (SDR) front end operating at microwave frequencies.

In some examples, a channelizer 700, which may be implemented on a single chip) may have a bandwidth covering DC to about 18 GHz with up to 128 taps (e.g., using eight 16-tap FIR filters 500b, sixteen 8-tap FIR filters 500b, or the like).

Figure 8:
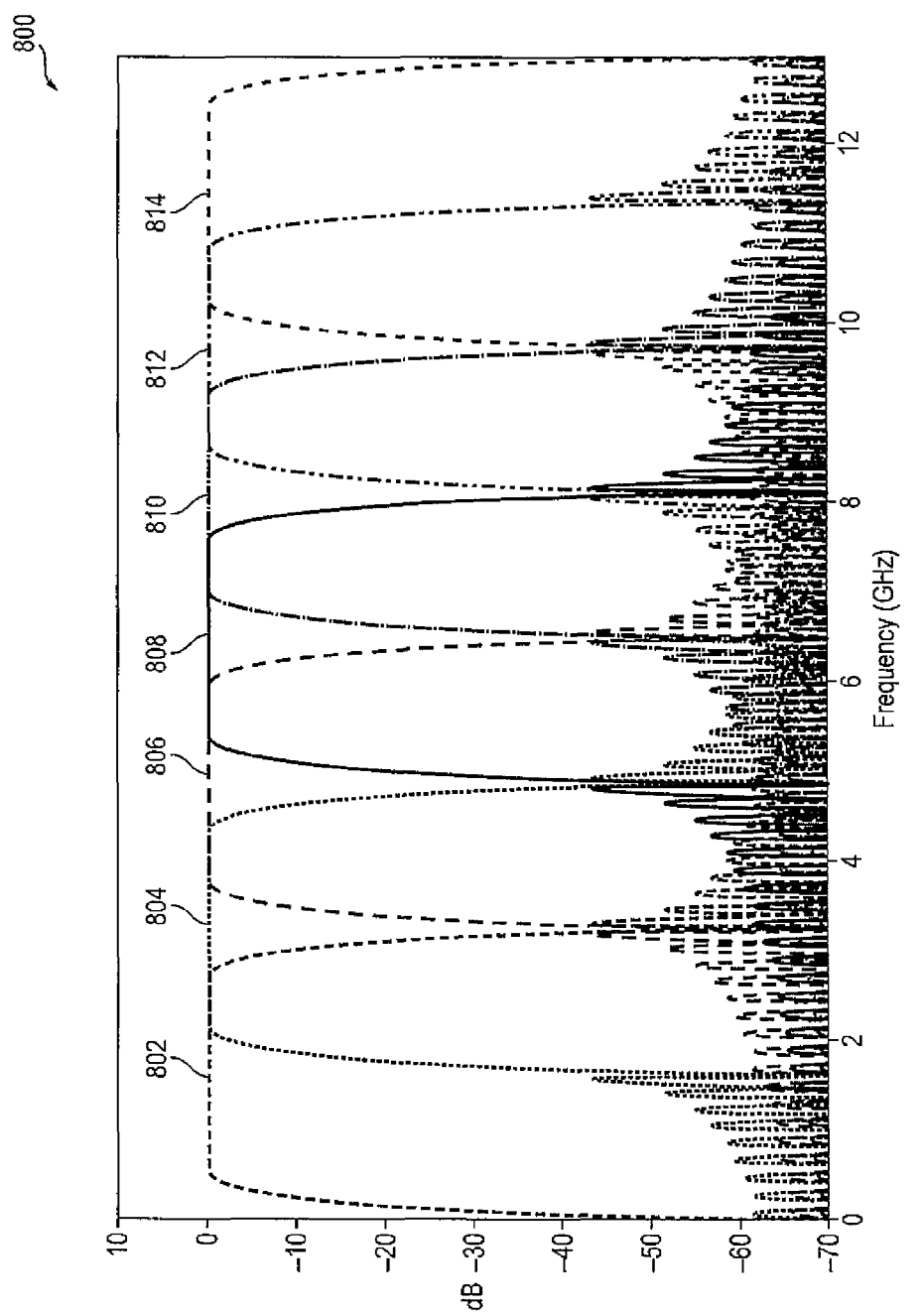
FIG. 8 is a block diagram illustrating the magnitude transfer function versus frequency of 7 channels of a 128-tap channelizer according to some exemplary embodiments of the present invention.

FIG. 8 is a diagram 800 illustrating the magnitude transfer function versus frequency of 7 channels of a 128-tap channelizer according to some exemplary embodiments of the present invention.

As shown in FIG. 8, in some examples, the channelizer 700 may include eight 16-tap FIR filters 500b for a total of 128 taps, according to some examples. The system clock may be about 26 GHz, and each of the FIR filters 500b may operate as a bandpass filter having a 3 dB bandwidth of about 2.75 GHz. The frequency bands of the successive FIR filters 500b (as represented with curves 802 to 814) may overlap to eliminate any spectral holes and result in a wide channelizer bandwidth of about 12.5 GHz.

Figure 9:
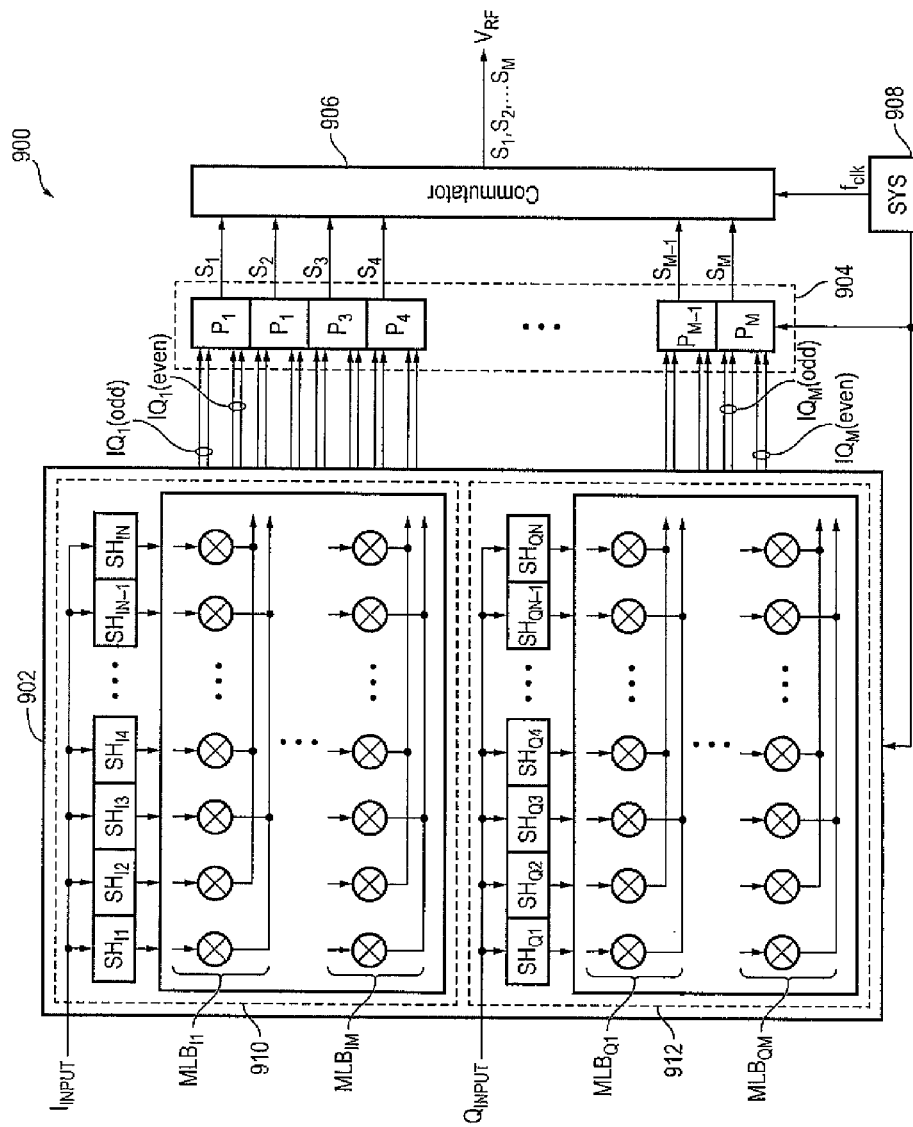
FIG. 9 is a block diagram of an upsampler utilizing the FIR filters, according to some exemplary embodiments of the present invention.

FIG. 9 is a block diagram of an upsampler 900 utilizing the FIR filters 500b, according to some exemplary embodiments of the present invention.

Referring to FIG. 9, an upsampler (e.g., a transmission upsampler) 900 converts a time baseband input signal (e.g., a complex discrete-time baseband input signal), represented by an imaginary component $I_{INPUT}$ and a real component $Q_{INPUT}$, into a radio frequency voltage signal suitable for transmission by an antenna element (of, e.g., a phased array antenna). According to some embodiments, an upsampler 900 includes a filter bank 902, a phase modulator 904, a commutator 906, and a clock generator 908.

In some embodiments, the filter bank 902 includes an imaginary filter bank 910 and a real filter bank 912. The imaginary filter bank 910 includes a plurality of sample and hold (S/H) circuits $SH_{11}$ to $SH_{IN}$ for simultaneously receiving, sampling, and holding the imaginary component $I_{INPUT}$ of the complex baseband digital input signal, and a plurality of multiplier banks $MLB_{11}$ to $MLB_{IM}$ for multiplying the samples supplied by the S/H circuits $SH_{11}$ to $SH_{IN}$ by the appropriate factors, which may be provided by associated coefficient generators. In some embodiments, the imaginary filter bank 910 is the same or substantially the same as the FIR filter bank 600 of the embodiments of FIG. 6, except that a single row of S/H circuits $SH_{11}$ to $SH_{IN}$ may provide samples to all of the multiplier banks $MLB_{11}$ to $MLB_{IM}$, as opposed to each multiplier bank having a separate row of S/H circuits.

According to some embodiments, the real filter bank 912 is substantially the same as the imaginary filter bank 910, except that the constituent multiplier banks $MLB_{Q1}$ to $MLB_{QM}$ operate on the real component $Q_{INPUT}$ of the complex baseband digital input signal, rather than the associated imaginary component $I_{INPUT}$. Further, the coefficients applied to the multiplier banks $MLB_{Q1}$ to $MLB_{QM}$ may be different from those applied to the multiplier banks $MLB_{11}$ to $MLB_{IM}$ operate in the imaginary filter bank 910.

According to some embodiments, each of the multiplier banks $MLB_{11}$ to $MLB_{IM}$ and $MLB_{Q1}$ to $MLB_{QM}$ includes a plurality of multipliers that are the same or substantially the same as the analog multipliers 200a.

The imaginary filter bank 910 and the real filter bank 912 operate in synchronization (e.g., simultaneously) to generate a plurality of outputs represented by $IQ_1$(odd) to $IQ_M$(odd) and $IQ_1$(even) to $IQ_M$(even), which may be discrete analog signal, and to supply the same to the phase modulator 904.

In some embodiments, the phase modulator 904 includes a plurality of phase modulation circuits $P_1$ to $P_M$, each of which may include four DFT circuits that are the same or substantially the same as those of the fourier transform block 706 of the embodiments of FIG. 7. The DFT circuits may have imaginary and real DFT coefficients applied thereto that follow Equations 8-9 above. The phase modulation circuits $P_1$ to $P_M$ generate, at their outputs, respective one of the real discrete analog samples $S_1$ to $S_M$, which may be current signals.

According to some embodiments, the commutator 906 performs the inverse operation of the polyphase sampler 702 of the embodiments of FIG. 7, and combines the individual analog samples S1 to SM into a sequence of analog samples (e.g., a discrete-time analog sample stream) $S_1, S_2, \ldots, S_M$, as shown in FIG. 9. In some examples, the commutator 906 may include a rotating mux. The commutator may further convert the analog sample stream $S_1, S_2, \ldots, S_M$ into voltage signals, e.g., by passing the signals through a resistor. The analog sample stream $S_1, S_2, \ldots, S_M$ may then be supplied to an antenna element of a polyphase antenna for transmission to a destination point.

The clock generator 908 may generate a clock signal having a frequency fax, and transmit the clock signal to the commutator 906. The frequency $f_{CLK}$ may represent (e.g., be the same as) the sampling frequency of the commutator 906. The clock generator may further produce a slower clock signal (e.g., one having a frequency $f_{CLK}/M$) and transmit said signal to the filter bank 902 and the phase modulator 904 for controlling the timing of (and synchronizing) the operation of the constituent components of the filter bank 902 and the phase modulator 904.

While one or more exemplary embodiments have been described with reference to the figures, it will be understood by those of ordinary skill in the art that various suitable changes in form and details may be made therein without departing from the spirit and scope as defined by the following claims, and equivalents thereof.

It will be understood that, although the terms "first", "second", "third", etc., may be used herein to describe various elements, components, regions, layers and/or sections, these elements, components, regions, layers and/or sections should not be limited by these terms. These terms are used to distinguish one element, component, region, layer or section from another element, component, region, layer or section. Thus, a first element, component, region, layer or section discussed below could be termed a second element, component, region, layer or section, without departing from the spirit and scope of the inventive concept.

The terminology used herein is for the purpose of describing particular embodiments and is not intended to be limiting of the inventive concept. As used herein, the singular forms "a" and "an" are intended to include the plural forms as well, unless the context clearly indicates otherwise. It will be further understood that the terms "include," "including," "comprises," and/or "comprising," when used in this specification, specify the presence of stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items. Further, the use of "may" when describing embodiments of the inventive concept refers to "one or more embodiments of the inventive concept." Also, the term "exemplary" is intended to refer to an example or illustration.

It will be understood that when an element, component, or layer is referred to as being "connected to" or "coupled to" another element or layer, it can be directly connected to or coupled to the other element or layer, or one or more intervening elements, components, or layers may be present. When an element or layer is referred to as being "directly on," "directly connected to" or "directly coupled to" another element, component, or layer, there are no intervening elements, component, or layers present.

As used herein, the term "substantially," "about," and similar terms are used as terms of approximation and not as terms of degree, and are intended to account for the inherent variations in measured or calculated values that would be recognized by those of ordinary skill in the art.

As used herein, the terms "use," "using," and "used" may be considered synonymous with the terms "utilize," "utilizing," and "utilized," respectively.

The analog multiplier 200a, the FIR filter bank 600, the channelizer 700, and the upsampler 900 (hereinafter collectively referred to as "FIR devices"), and/or any other relevant devices or components according to embodiments of the present invention described herein may be implemented utilizing any suitable hardware, firmware (e.g. an application-specific integrated circuit, field programmable gate arrays, and/or the like), software, or a suitable combination of software, firmware, and hardware. For example, the various components of each of the FIR devices may be formed on one integrated circuit (IC) chip or on separate IC chips. Further, the various components of each of the FIR devices may be implemented on a flexible printed circuit film, a tape carrier package (TCP), a printed circuit board (PCB), or formed on a same substrate. Further, the various components of each of the FIR devices may be a process or thread, running on one or more processors, in one or more computing devices, executing computer program instructions and interacting with other system components for performing the various functionalities described herein. The computer program instructions are stored in a memory which may be implemented in a computing device using a standard memory device, such as, for example, a random access memory (RAM). The computer program instructions may also be stored in other non-transitory computer readable media such as, for example, a CD-ROM, flash drive, or the like. Also, a person of skill in the art should recognize that the functionality of various computing devices may be combined or integrated into a single computing device, or the functionality of a particular computing device may be distributed across one or more other computing devices without departing from the scope of the exemplary embodiments of the present invention.

What is claimed is:

1. A finite impulse response (FIR) filter for filtering an input voltage signal to generate an output current signal, the FIR filter comprising:
   a plurality of sample and hold (SH) circuits configured to simultaneously receive the input voltage signal, to sample the input voltage signal at successive sample times according to a sample clock, and to generate a plurality of sampled voltage signals;
   a plurality of programmable analog multipliers coupled to the plurality of SH circuits and configured to multiply the plurality of sampled voltage signals by a plurality of binary multiplication factors to generate the output current signal, each of the programmable analog multipliers being a voltage-to-current multiplier;
   a power controller configured to dynamically adjust a filtering profile of the FIR filter by selectively and dynamically activating or deactivating ones of the plurality of programmable analog multipliers during operation of the FIR filter; and
   a plurality of rotating shift registers configured to circularly rotate the plurality of binary multiplication factors through memory positions of the plurality of rotating shift registers at each one of the successive sample times, and to supply the plurality of binary multiplication factors to the plurality of programmable analog multipliers,
   wherein, in response to the power controller selectively and dynamically activating or deactivating ones of the plurality of programmable analog multipliers, the plurality of rotating shift registers are configured to correspondingly adjust a number of the memory positions and a number of the plurality of binary multiplication factors,
   wherein outputs of odd ones of the plurality of programmable analog multipliers are electrically shorted together and outputs of even ones of the plurality of programmable analog multipliers are electrically shorted together to respectively generate an odd output current signal and an even output current signal, and
   wherein the output current signal comprises the odd and even output current signals.

2. The FIR filter of claim 1, wherein the plurality of sampled voltage signals have a same duration and are staggered in time.

3. The FIR filter of claim 1, further comprising a timing controller configured to generate a plurality of control signals for triggering sample times of the plurality of SH circuits, wherein consecutive ones of the plurality of control signals are offset in time by a sampling period.

4. The FIR filter of claim 1, wherein each one of the plurality of programmable analog multipliers is configured to convert a respective one of the plurality of sampled voltage signals to a current signal before multiplying the current signal by a respective one of the plurality of binary multiplication factors.

5. The FIR filter of claim 1, wherein each one of the plurality of rotating shift registers comprises a localized calibration value associated with a respective one of the plurality of programmable analog multipliers, the localized calibration value compensating for gain errors of the respective one of the plurality of programmable analog multipliers.

6. The FIR filter of claim 1, wherein a frequency of the sample clock is programmable.

7. A programmable discrete time analog channelizer configured to selectively filter an analog input signal, the programmable discrete time analog channelizer comprising:
   a plurality of FIR filters, each of the plurality of FIR filters configured to receive a sample stream of a plurality of sample streams and comprising:
      a plurality of sample and hold (SH) circuits configured to simultaneously receive the sample stream, to sample the sample stream at successive sample times, and to generate a plurality of sampled voltage signals;
      a plurality of programmable analog multipliers coupled to the plurality of SH circuits and configured to multiply the plurality of sampled voltage signals by a plurality of binary multiplication factors to generate an output current signal of a plurality of output current signals, each of the programmable analog multipliers being a voltage-to-current multiplier;
      a power controller configured to dynamically adjust a filtering profile of the FIR filter by selectively and dynamically activating or deactivating ones of the plurality of programmable analog multipliers during operation of the FIR filter; and
      a plurality of rotating shift registers configured to circularly rotate the plurality of binary multiplication factors through memory positions of the plurality of rotating shift registers at each one of the successive sample times, and to supply the plurality of binary multiplication factors to the plurality of programmable analog multipliers,
      wherein, in response to the power controller selectively and dynamically activating or deactivating ones of the plurality of programmable analog multipliers, the plurality of rotating shift registers are configured to correspondingly adjust a number of the memory positions and a number of the plurality of binary multiplication factors, wherein outputs of odd ones of the plurality of programmable analog multipliers are electrically shorted together and outputs of even ones of the plurality of programmable analog multipliers are electrically shorted together to respectively generate an odd output current signal and an even output current signal, and wherein the output current signal comprises the odd and even output current signals; and a plurality of fourier transform circuits configured to multiply the plurality of output current signals by a plurality of fourier transform coefficients to generate a plurality of fourier transform outputs, a summation of the plurality of fourier transform outputs comprising a filtered output of the programmable discrete time analog channelizer, wherein the plurality of sample streams represents the analog input signal.

8. The programmable discrete time analog channelizer of claim 7, wherein the plurality of binary multiplication factors are programmable and determine a profile of the filtered output.

9. The programmable discrete time analog channelizer of claim 7, wherein the plurality of fourier transform coefficients are programmable and determine a center frequency of the filtered output.

10. The programmable discrete time analog channelizer of claim 7, further comprising a timing controller configured to generate a plurality of enable signals for triggering sample times of the plurality of SH circuits of the plurality of FIR filters, wherein consecutive ones of the plurality of enable signals are offset in time by a sampling period.

11. The programmable discrete time analog channelizer of claim 7, further comprising a polyphase sampler configured to receive the analog input signal and to downsample the analog input signal, and to generate the plurality of sample streams.

12. The programmable discrete time analog channelizer of claim 7, further comprising an accumulator configured to sum the plurality of fourier transform outputs and to convert the summed plurality of fourier transform outputs to a voltage signal.

13. A programmable discrete time analog upsampler configured to generate a radio frequency (RF) voltage signal based on a baseband input signal, the programmable discrete time analog upsampler comprising:

a plurality of sample and hold (SH) circuits configured to simultaneously receive the baseband input signal, to sample the baseband input signal at successive sample times, and to generate a plurality of sampled voltage signals;

a plurality of programmable analog multipliers coupled to the plurality of SH circuits and configured to multiply the plurality of sampled voltage signals by a plurality of binary multiplication factors to generate an output current signal of a plurality of output current signals, each of the programmable analog multipliers being a voltage-to-current multiplier;

a power controller configured to dynamically adjust a filtering profile of the FIR filter by selectively and dynamically activating or deactivating ones of the plurality of programmable analog multipliers during operation of the FIR filter; and a plurality of rotating shift registers configured to circularly rotate the plurality of binary multiplication factors through memory positions of the plurality of rotating shift registers at each one of the successive sample times, and to supply the plurality of binary multiplication factors to the plurality of programmable analog multipliers, wherein, in response to the power controller selectively and dynamically activating or deactivating ones of the plurality of programmable analog multipliers, the plurality of rotating shift registers are configured to correspondingly adjust a number of the memory positions and a number of the plurality of binary multiplication factors, wherein outputs of odd ones of the plurality of programmable analog multipliers are electrically shorted together and outputs of even ones of the plurality of programmable analog multipliers are electrically shorted together to respectively generate an odd output current signal and an even output current signal, and wherein the output current signal comprises the odd and even output current signals; and a plurality of inverse fourier transform circuits configured to multiply the plurality of output current signals by a plurality of fourier transform coefficients to generate a plurality of fourier transform outputs, a commutator configured to receive the plurality of fourier transform outputs and to generate the RF voltage signal.

* * * * *